(12) United States Patent
Carley et al.

(10) Patent No.: US 12,315,697 B2
(45) Date of Patent: May 27, 2025

(54) METHOD AND APPARATUS FOR USE IN GENERATING PLASMA

(71) Applicant: Dyson Technology Limited, Wiltshire (GB)

(72) Inventors: Sean Michael Carley, Gloucester (GB); Sven Gauter, London (GB)

(73) Assignee: Dyson Technology Limited, Wiltshire (GB)

( * ) Notice: Subject to any disclaimer, the term of this patent is extended or adjusted under 35 U.S.C. 154(b) by 374 days.

(21) Appl. No.: 17/785,873

(22) PCT Filed: Dec. 4, 2020

(86) PCT No.: PCT/GB2020/053112
§ 371 (c)(1),
(2) Date: Jun. 15, 2022

(87) PCT Pub. No.: WO2021/123727
PCT Pub. Date: Jun. 24, 2021

(65) Prior Publication Data
US 2023/0028207 A1    Jan. 26, 2023

(30) Foreign Application Priority Data
Dec. 16, 2019    (GB) .................................... 1918481

(51) Int. Cl.
*H01J 37/32* (2006.01)
*C23C 14/34* (2006.01)
*C23C 14/35* (2006.01)

(52) U.S. Cl.
CPC ...... *H01J 37/3211* (2013.01); *C23C 14/3471* (2013.01); *C23C 14/358* (2013.01); *H01J 37/32651* (2013.01)

(58) Field of Classification Search
CPC ........ H01J 37/34; H01J 37/321; H01J 37/345; H01J 37/3211; H01J 37/3441;
(Continued)

(56) References Cited

U.S. PATENT DOCUMENTS 4,725,449 A    2/1988   Ehlers et al.
4,841,409 A    6/1989   Kalwar
(Continued)

FOREIGN PATENT DOCUMENTS

CN    101460002 A    6/2009
CN    102573265 A    7/2012
(Continued)

OTHER PUBLICATIONS

Office Action received for Japanese Patent Application No. 2022-536797, mailed on Jul. 4, 2023, 10 pages (6 pages of English Translation and 4 pages of Original Document).
(Continued)

*Primary Examiner* — Tung X Le
(74) *Attorney, Agent, or Firm* — Tucker Ellis LLP

(57) ABSTRACT

A method of generating a plasma is provided. The method uses a plasma antenna having a length, the method including driving an electrical conductor of the plasma antenna with RF frequency current to generate plasma both at a first location and at a second location spaced apart from the first location in a direction along the length of the antenna, there being a region adjacent to the antenna between the first location and the second location at which the generation of plasma is curtailed as a result of at least one shield member.

28 Claims, 12 Drawing Sheets

(58) Field of Classification Search
CPC .......... H01J 37/32467; H01J 37/32651; H01J 37/32669; H01J 2237/332
See application file for complete search history.

(56) References Cited

U.S. PATENT DOCUMENTS

| | | | |
|---|---|---|---|
| 5,560,776 | A | 10/1996 | Sugai et al. |
| 5,587,226 | A | 12/1996 | Leung et al. |
| 5,795,429 | A | 8/1998 | Ishii et al. |
| 5,994,236 | A | 11/1999 | Ogle |
| 6,080,271 | A | 6/2000 | Fujii |
| 6,181,069 | B1 | 1/2001 | Tonotani et al. |
| 6,251,792 | B1 | 6/2001 | Collins et al. |
| 6,806,653 | B2* | 10/2004 | Strang ............... H01J 37/32082 315/111.41 |
| 6,863,773 | B1 | 3/2005 | Emmerich et al. |
| 10,790,122 | B2* | 9/2020 | Hong ...................... H01J 37/32 |
| 11,515,122 | B2* | 11/2022 | Lane ................. H01L 21/67069 |
| 2003/0087488 | A1 | 5/2003 | Fink et al. |
| 2003/0095072 | A1 | 5/2003 | Kwon et al. |
| 2003/0228416 | A1 | 12/2003 | Iwamaru |
| 2004/0011466 | A1 | 1/2004 | Matsumoto et al. |
| 2004/0027293 | A1 | 2/2004 | Miyake et al. |
| 2004/0060662 | A1 | 4/2004 | Yeom et al. |
| 2007/0193512 | A1 | 8/2007 | Deguchi et al. |
| 2007/0235327 | A1 | 10/2007 | Vukovic |
| 2008/0050537 | A1 | 2/2008 | Godyak |
| 2008/0067430 | A1* | 3/2008 | Hershkowitz ............ H05H 1/54 250/492.3 |
| 2008/0272700 | A1 | 11/2008 | Lin et al. |
| 2010/0078320 | A1* | 4/2010 | Stowell ............. H01J 37/32477 204/192.12 |
| 2010/0116790 | A1 | 5/2010 | Spitzl |
| 2010/0206846 | A1 | 8/2010 | Nishimura et al. |
| 2011/0018443 | A1 | 1/2011 | Kou et al. |
| 2011/0076420 | A1 | 3/2011 | Stowell |
| 2011/0080094 | A1 | 4/2011 | Setsuhara et al. |
| 2012/0211166 | A1 | 8/2012 | Yevtukhov et al. |
| 2012/0293070 | A1 | 11/2012 | Kurunczi et al. |
| 2013/0047923 | A1* | 2/2013 | Kato .................. C23C 16/4586 118/723 AN |
| 2013/0193848 | A1 | 8/2013 | Biloiu et al. |
| 2014/0196849 | A1 | 7/2014 | Nguyen et al. |
| 2015/0024609 | A1 | 1/2015 | Milligan et al. |
| 2015/0091442 | A1 | 4/2015 | Mai et al. |
| 2016/0071704 | A1 | 3/2016 | Benveniste et al. |
| 2016/0079042 | A1 | 3/2016 | Likhanskii et al. |
| 2016/0233047 | A1 | 8/2016 | Tang et al. |
| 2018/0308661 | A1 | 10/2018 | Collins et al. |

FOREIGN PATENT DOCUMENTS

| | | |
|---|---|---|
| DE | 4136297 A1 | 5/1993 |
| EP | 0468758 A1 | 1/1992 |
| EP | 1860680 A1 | 11/2007 |
| GB | 2576539 A | 2/2020 |
| JP | 2000-345351 A | 12/2000 |
| JP | 2003-086581 A2 | 3/2003 |
| JP | 2004-055600 A | 2/2004 |
| JP | 2009-140899 A | 6/2009 |
| JP | 2011-181292 A2 | 9/2011 |
| JP | 2012-038568 A2 | 2/2012 |
| JP | 2018-014170 A2 | 1/2018 |
| KR | 20040010220 A | 1/2004 |
| KR | 2007-0079870 A | 8/2007 |
| KR | 100753868 B1 | 9/2007 |
| KR | 2008-0024624 A | 3/2008 |
| KR | 2008-0024693 A | 3/2008 |
| KR | 2009-0018544 A | 2/2009 |
| KR | 2009-0033718 A | 4/2009 |
| KR | 10-2009-0076159 A | 7/2009 |
| KR | 2009-0073327 A | 7/2009 |
| KR | 2009-0076159 A | 7/2009 |
| KR | 2009-0079696 A | 7/2009 |
| KR | 2011-0012167 A | 2/2011 |
| KR | 2011-0027396 A | 3/2011 |
| KR | 2012-0060017 A | 6/2012 |
| KR | 2012-0090345 A | 8/2012 |
| KR | 2014-0125121 A | 10/2014 |
| KR | 2017-0104063 A | 9/2017 |
| KR | 2017-0110001 A | 10/2017 |
| KR | 2018-0104348 A | 9/2018 |
| RU | 2601947 C2 | 11/2016 |
| RU | 2642493 C1 | 1/2018 |
| WO | 2002/084700 A1 | 10/2002 |
| WO | 2005/057607 A2 | 6/2005 |
| WO | 2007/117122 A1 | 10/2007 |
| WO | 2011/131921 A1 | 10/2011 |
| WO | 2018/173892 A1 | 9/2018 |
| WO | 2021/123729 A1 | 6/2021 |

OTHER PUBLICATIONS

International Search Report and Written Opinion received for PCT Patent Application No. PCT/GB2020/053114, mailed on Mar. 9, 2021, 11 pages.

Examination Report and Search Report received for Patent Application No. GB 1918480.3, mailed on Jun. 29, 2022, 4 pages.

International Search Report and Written Opinion received for PCT Patent Application No. PCT/GB2020/053112, mailed on Mar. 4, 2021, 12 pages.

International Search Report and Written Opinion received for PCT Patent Application No. PCT/GB2020/053113, mailed on Mar. 5, 2021, 12 pages.

Search Report received for Patent Application No. GB 1918481.1, mailed on May 29, 2020, 1 page.

* cited by examiner

METHOD AND APPARATUS FOR USE IN GENERATING PLASMA

CROSS-REFERENCE TO PRIOR APPLICATION

This application is a § 371 National Stage Application of PCT International Application No. PCT/GB2020/053112 filed Dec. 4, 2020, which claims the priority of United Kingdom Application No. 1918481.1, filed Dec. 16, 2019, each of which are herein incorporated by reference in their entirety.

FIELD OF THE INVENTION

The present invention concerns plasma generation. More particularly, but not exclusively, this invention concerns a method of generating plasma and apparatus for use in generating plasma, such as a plasma antenna, plasma antenna assembly and/or a plasma reactor. The invention also concerns a method of depositing a material on a substrate with the use of plasma and an electronic device including a layer of material that has been deposited using sputter deposition. Embodiments of the present invention relate to generating a uniform sheet of high density plasma.

BACKGROUND OF THE INVENTION

High density plasmas are used in a wide range of industrial applications. For instance, such plasmas can be used in surface cleaning or preparation applications, etching applications, modifying surface structures or densities, and the deposition of thins films. A high density plasma can be generated as an inductively coupled plasma ("ICP") by means of a time-varying magnetic field caused by driving one or more plasma antennae with time-varying electric currents thus producing a plasma by means of electromagnetic induction.

Certain apparatus of the prior art relate to generating wide continuous sheets of high density plasma. These can use separate plasma sources with plasma chambers to generate the plasma (i.e. remote plasma sources). An example of such a plasma source is a multiple loop antenna arrangement that requires many antennas to create a wide working plasma. However, controlling the uniformity of the plasma generated by such multi-loop antenna systems can be difficult since the antennas need to be tuned to a precise equivalent power and frequency in order to achieve plasma uniformity. The multi loop antenna arrangement also consumes a large amount of power since multiple plasmas are generated.

An inductively coupled plasma may be formed such that the plasma is uniformly created around the antenna. The antenna will typically be housed in a housing, such as a quartz tube. The plasma generated may thus be in contact with a relatively large surface area of the wall(s) of the housing which results in high losses due to recombination at the wall. In many applications, the actual interaction of the plasma is only desirable in distinct regions (e.g. at the substrate), while excessive interaction with the wall can lead to unwanted heating or the formation of impurities. Poor control of the plasma can lead to poor power efficiency. There is therefore a desire to control better the geometry and/or position of the plasma generation region to take full advantage of the properties of the plasma and/or with improved efficiency.

U.S. Pat. No. 6,181,069 discloses a plasma chamber having linear plasma antennae arranged across the chamber. Plasma is created in the chamber for the purpose of processing a workpiece, by for example etching the workpiece or thin film formation on the workpiece. One embodiment of U.S. Pat. No. 6,181,069 requires the antenna to be mounted eccentrically in a quartz tube to limit the creation of so-called useless plasma in an area remote from the processing on the workplace and to control the density distribution of the plasma to be higher where so needed. U.S. Pat. No. 6,181,069 also discloses other shapes of antenna and/or different shapes of quartz tube for housing the antenna, or a part thereof, for purpose of controlling the density of the plasma in the interior of the plasma chamber. The techniques employed for the efficient generation of plasma in U.S. Pat. No. 6,181,069 rely on changing the shape of the antenna and/or the shape of the quartz tube housing and/or the spatial relationship between the antenna and the quartz tube. It is believed that further efficiencies may be gained and/or that efficient generation of plasma at the required densities in the regions of interest can be achieved using different techniques.

The present invention seeks to mitigate one or more of the above-mentioned problems. Alternatively or additionally, the present invention seeks to provide an improved method of generating plasma and/or an improved plasma antenna.

SUMMARY OF THE INVENTION

One aspect of the invention relates to an antenna for generating plasma, for example a volume of inductively coupled plasma. An antenna used for generating plasma will be referred to herein using the term "plasma antenna".

The plasma antenna may be elongate in shape and may extend in a direction having a length. The antenna, or a part thereof, may have a length. The length of the antenna may have a shape which generally extends in a single direction.

The length of the antenna may extend between first and second locations, in a direction that is substantially linear [e.g. extending in a generally straight line]. The plasma antenna may have one or more straight sections. For example, there may comprise a first straight section and a second straight section (which is optionally parallel to, or extends in the same general direction as, the first section), such that in use there is a plasma generation region which is located between the first and second straight sections.

The antenna comprises an electrical conductor, for example copper. In examples, the antenna can be considered to be such an electrical conductor, for example a wire or tube of some form. In other examples, the electrical conductor includes other materials. The plasma antenna may be a copper antenna.

The plasma antenna may be tubular in part, which may for example, facilitate cooling of the antenna during use.

The plasma antenna may be coiled along its length. For example, the antenna may have helical coils having an axis aligned with the direction along which the antenna extends. In certain embodiments, the antenna is a helically wound wire. The provision of a wound wire allows for improved plasma generation. The axis of the coiled antenna may be substantially straight, for example have a shape which generally extends in a single direction.

Instead of following a generally linear path, or having a helical shape with a straight axis, the length of (or axis of) the antenna may take a sinuous path. Such a shape may allow for the creation of plasma generation hot-spots, which may be useful for certain applications.

It will be appreciated that in use, the plasma antenna or one or more portions thereof, is configured (i.e. typically as a result of the application of radio frequency electrical power), to excite a gaseous medium thereby generating a plasma, for example forming a plasma along the length of the antenna. Such a plasma may for example be generated within a process chamber, in which the antenna is located. In examples, the plasma can be generated along the entire length of an antenna within the processing chamber.

In examples, the plasma may be generated with the use of at least two lengths of plasma antenna being spaced laterally apart from each other (and for example parallel to each other). The two lengths of plasma antenna may be driven by a common RF current source and/or may be electrically coupled to each other.

There may be an electrically conductive shield member. Such a shield member may restrict (for example prevent) the generation of plasma at one or more regions. There may be a region adjacent to the antenna between the first location and the second location at which the generation of plasma is curtailed and/or inhibited as a result of at least one shield member. This can improve electrical efficiency as a result of reducing undesirable recombination of plasma ions and/or localise the plasma to those regions where it is needed (for whatever process or use the plasma is provided for).

At least a portion of the electrical conductor of the antenna may be provided with a cover comprising a dielectric material. The cover is provided to inhibit plasma ignition adjacent to the electrical conductor, which may cause unwanted deterioration of the electrical conductor, reducing the functional lifetime of the antenna. For example, the cover may isolate the electrical conductor from the plasma. Such a cover may have a mean thickness of at least 20 microns. Such a cover may have a thermal conductivity of at least 5 W/m·K. Such a cover may have a thermal expansion co-efficient of no more than $50 \times 10^{-6}$/K. The thermal conductivity and thermal expansion co-efficient values may be room temperature values, for example, at 20° C. The cover may be a dielectric cover. The cover may consist essentially of a dielectric material. In examples (described in more detail below), such a cover may be in the form of a coating on the electrical conductor of the antenna. One or more interlayers may be provided between the electrical conductor and the coating. The coating may be compatible with the thermal characteristics and temperature profiles typical during use of the plasma antenna. The thermal expansion coefficient of the coating may be no more than 50% of the thermal expansion coefficient of the electrical conductor. The use of such a cover may negate the need for a quartz tube housing and/or may facilitate the use of the antenna in the direct presence of a gas, at non-negligible pressures. The thickness of the cover may be less than 2 mm. The cover may, for example, comprise and optionally consist essentially of, one or more nitrides, such as one or both of silicon nitride and aluminium nitride. The cover may have an electrical resistivity of at least $10^{15}$ Ωcm. Electrical resistivity value may be a room temperature value, for example, at 20° C. The cover may have a mean thickness of at least 50 microns, optionally at least 100 microns, optionally at least 200 microns, and optionally at least 500 microns. The cover may have a mean thickness of no more than 5.0 mm, optionally no more than 4.0 mm, optionally no more than 3.0 mm, optionally no more than 2.0 mm and optionally no more than 1.0 mm. In certain embodiments, the thickness of the cover should be sufficiently high to electrically isolate or insulate the electrical conductor of the antenna from the surrounding plasma, but not so high as to cause an unwantedly high decrease in coupling efficiency.

The antenna may be configured to be fluid-cooled. For example, the antenna may be provided with a lumen for the receipt of a cooling fluid, such as a cooling liquid, such as water.

In examples, the cover, or parts thereof, may be directly adjacent to but spaced apart from the electrical conductor of the antenna. The cover may comprise a cover member. There may be a gap between at least part of the cover member and at least part of the electrical conductor. In examples, the gap is sufficiently small to inhibit plasma ignition within the gap. The gap may for example be no more than 1.0 mm. Structure, such as one or more spacers, may be provided for positioning the cover member relative to the electrical conductor, for example holding the cover member in spaced relationship to the electrical conductor, optionally thereby providing a gap between at least part of the cover member and part of the electrical conductor. The structure may comprise one or more spacers.

There may be a first portion of the electrical conductor of the antenna which extends beyond a first end of the cover member. The first portion of the electrical conductor is therefore not covered by the cover member. The configuration of such an antenna in use, within a plasma reactor, may be such that the part of the antenna provided with the cover member is exposed to ambient conditions in the plasma reactor and the first portion of the electrical conductor is isolated from the ambient conditions in the plasma reactor. There may be a second portion of the electrical conductor which extends beyond a second end of the cover member. The second portion of the electrical conductor is therefore not covered by the cover member. The second portion of the electrical conductor may also be isolated from the ambient conditions in the plasma reactor. In examples, there is a first partition (and optionally a second partition) that isolates the first and/or second portion (when present) from the ambient conditions in the plasma reactor. There may be a gap between the cover member and such a first and/or second partition, said gap being sufficiently small to inhibit plasma ignition within said gap.

There may be provided an antenna assembly comprising a plasma antenna and one or more materials, devices or other measures which affect the generation of plasma (e.g. the location, density and/or shape of the plasma). For example, the plasma antenna assembly may include one or more shield members. The plasma antenna assembly may include a cover, such as a cover discussed above.

The plasma antenna assembly may include a housing, for example being a tube, in which the antenna is located. The housing may be transparent, or optionally at least partially transparent, to RF electromagnetic radiation, such that it does not interfere with the generation of plasma outside the housing. The housing may comprise one or more walls. Such walls may be of quartz material. In examples, the housing is a quartz tube.

The housing can be formed such that parts or sections of the housing are opaque to the transmission of RF radiation, so that plasma is generated only in the sections where the housing is transparent. In examples, only a cross sectional side surface of the housing, for example a surface facing one or more magnets of the apparatus, is transparent to RF radiation, such that the RF radiation is transmitted only in the desired direction (for example within a process chamber) to propagate the plasma.

In examples, the housing is elongate and has at least a portion that has a length which follows a straight line path. The antenna may comprise at least a portion of straight wire, or tube. The antenna may be located in the housing such that it extends along the length of the housing, for example through its centre or central axis. Other configurations may have advantages in certain embodiments (the antenna need not be a straight wire extending through the centre of the housing in other examples). The antenna may for instance extend through the housing at an angle offset from the centreline of the housing such that one part or end of the antenna is closer to the internal wall of the housing relative to another part or end of the antenna. This would encourage plasma formation in a particular regions (for example in a particular part of a processing chamber) if required for certain applications. The position of the antenna may not be fixed. For example, the antenna could be configured to move further away from the internal walls of the housing during operation, for instance, if intermittent plasma generation is required.

The antenna may be arranged eccentrically in its housing, such that the longitudinal axis of the antenna is spaced apart from the longitudinal axis of the housing. Such an arrangement may assist with ensuring that plasma is generated in the desired location.

The housing may comprise two or more elongate portions, for example tubes, which each surround respective sections (e.g. straight sections) of the antenna.

The housing may form an air-tight region around at least part of the plasma antenna.

The shield member(s) described herein may be mounted externally of the housing, and optionally in contact with the housing.

There may be a ferromagnetic or ferrimagnetic material arranged to partially surround the antenna, preferably so as to increase the magnetic flux density in the plasma generation region. The use of such material may enhance the generation of plasma at one or more regions and/or localise the plasma to such region(s). This can improve electrical efficiency as a result of reducing undesirable recombination of plasma ions and/or localise the plasma to those regions where it is needed (for whatever process or use the plasma is provided for). A ferromagnetic or ferrimagnetic material arranged to partially surround the antenna so as to increase the magnetic flux density in the plasma generation region may herein be referred to as a focussing member.

The focussing member may be shielded (i.e. with shielding) from external magnetic fields, i.e. magnetic fields not generated by the antenna/generated externally to the plasma antenna assembly. External magnetic fields may be present at the focussing member due to one or more magnets (e.g. electromagnets) located in the plasma generation apparatus which confine and/or propagate the plasma to a location that is remote from the plasma antenna. Hence, the focussing member may be shielded from the magnetic field generated by the one or more magnets.

It will be appreciated that the focussing member may not be completely shielded from external magnetic fields. For example, the effect of the magnetic field generated by the one or more magnets may be measurable (i.e. non-negligible) at the focussing member. However, the shielding may reduce the strength/effect of that magnetic field such that the ferromagnetic or ferrimagnetic material of the focussing member is not saturated by external magnetic fields, and can thereby effectively re-direct the magnetic field generated by the antenna in order to increase the magnetic flux density in the plasma generation region.

The focussing member may be coated with a shielding material. The shielding material may comprise nickel. The shielding material may be a nickel alloy, for example MuMetal® alloy by Magnetic Shield Corporation, Bensen-ville, IL, USA. Alternatively or additionally, parts of the housing containing the antenna may be provided (e.g. coated) with shielding material. Alternatively or additionally, one or more standalone shield elements may be provided in the region between the focussing member and the one or more magnets in the plasma generation apparatus.

The ferromagnetic or ferrimagnetic material of the focussing member may be ferrite.

The housing may be configured such that in use it separates the focussing member from the plasma generated by the antenna. The focussing member may be provided in the housing with the antenna.

The length of the antenna that is partially surrounded by the focusing member may be offset from a central longitudinal axis of the housing. The offset may be such that the length of the antenna is positioned closer to the plasma generation region than the longitudinal axis of the housing. The offset may be such that the antenna extends proximate the wall of the housing.

The antenna and focussing member may be arranged on opposite sides of the plasma generation region (e.g. within the housing) in a generally symmetrical arrangement, i.e. a mirror image. For example, a plasma antenna assembly may comprise a first section comprising a first (e.g. straight/ linear) length of antenna that is partially surrounded by a first focussing member, and a second section comprising a second (e.g. straight/linear) length of antenna that is partially surrounded by a second focussing member, the first section being spaced apart from the second section, with the plasma generation region being between the first section and second section. The focussing member and length of the antenna in each section may be arranged to be generally symmetrical for example in mirror image.

In embodiments, the focussing member may be arranged so as to focus/concentrate the magnetic field such that the magnetic field is stronger at one lateral side of the plasma antenna assembly (compared to the other lateral side). For example, the position of maximum magnetic flux density may be shifted in the direction in which the plasma is to be propagated by the one or more magnets in the plasma generation apparatus.

Each focussing member may partially surround one or more lengths of antenna. Particularly in embodiments in which the antenna has a looping and/or looped (e.g. coiled and/or helical) arrangement around the plasma generation region, each focussing member may partially surround a plurality of lengths of antenna.

A further aspect of the invention relates to a method of generating plasma, for example a volume of inductively coupled plasma, which is generated with the use of a plasma antenna. The plasma antenna may be one in accordance with any aspect of the invention as claimed or described herein, possibly including any of the optional features mentioned herein relating to such a plasma antenna or plasma antenna assembly.

The antenna may be an RF-transmitter. In examples, the antenna is supplied with power from a radio frequency power supply system operating at a frequency between 1 MHz and 1 GHz; possibly a frequency between 1 MHz and 100 MHz; preferably a frequency between 10 MHz and 40 MHz; and in embodiments at a frequency of approximately 13.56 MHz or multiples thereof.

The antenna may be arranged to be driven at a frequency at which the relative magnetic permeability is greater than 10, optionally greater than 25, preferably greater than 100.

In examples, the method includes driving the antenna with RF frequency current to generate plasma, typically at electrical powers of at least 1 kW, and possibly 2 kW or more.

In embodiments that comprise a ferromagnetic or ferrimagnetic focussing member the antenna may be driven at a lower frequency than 13.56 MHz in order to reduce power loss into the focussing member. For example, the antenna may be driven at a frequency in the range 1 MHz to 10 MHz, for example the frequency may be approximately 2 MHz.

It may be that plasma is generated both at a first location and at a second location spaced apart from the first location in a direction along the length of the antenna. As mentioned above, one or more shield members may be provided. There may be a region adjacent to the antenna between the first location and the second location at which the generation of plasma is restricted (and/or curtailed, and/or inhibited) as a result of at least one shield member. The at least one shield member may prevent the generation of plasma.

The plasma generated at a location along the length of the antenna (which may be one or both of the aforesaid first location and second location) will typically extend circumferentially around the antenna by 45 degrees or more. The plasma generated may extend circumferentially around the antenna by more than 90 degrees, more than 180 degrees, and possibly more than 300 degrees. It may be that the plasma generated at one or both of the first location and the second location extends circumferentially all the way round the antenna.

The plasma generated at a location along the length of the antenna (which may be one or both of the aforesaid first location and second location) may extend circumferentially around the antenna by less than 270 degrees, and optionally by less than 210 degrees. It may be that the plasma generated extends circumferentially about half way round or less around the antenna.

The limit on the circumferential extent of the plasma around the antenna may be as a result of the one or more shield members. A shield member may extend more than 120 degrees round the axis of the antenna at at least one location along the length of the antenna (optionally all the way round). The at least one shield member may restrict the generation of plasma circumferentially around the antenna by more than 300 degrees. A shield member may extend around the axis of the antenna at at least one location along the length of the antenna by less than 240 degrees (optionally about half the way round).

It may be that in use the at least one shield member restricts the generation of plasma at all circumferential positions around at least one location along the length of the antenna. It may be that in use the at least one shield member restricts the generation of plasma circumferentially around the antenna by less than 270 degrees, at at least one location along the length of the antenna.

The arrangement of the shield members may be such that plasma is generated at one or both of the first location and the second location on opposite sides of the antenna and that the at least one shield member restricts the generation of plasma on both of those opposite sides at a different location (e.g. between the first location and the second location).

The arrangement of the shield members may be such that plasma is generated at one or both of the first location and the second location (for example only over a sector which extends circumferentially around the antenna by less than 300 degrees) and that the at least one shield member restricts the generation of plasma on the same location(s) along the length of the antenna as the plasma is generated.

It may be that a shield member restricts the generation of plasma at a further region that is on the opposite side of the first location from the second location, in the direction along the length of the antenna. It may be that a shield member restricts the generation of plasma at a further region that is on the opposite side of the second location from the first location, in the direction along the length of the antenna.

Each shield member may have a low relative magnetic permeability, for example of less than 250. The material from which the shield member may comprise material that has a low relative magnetic permeability, for example of less than 250. Such material may make up The relative magnetic permeability is preferably less than 100, optionally less than 25, and possibly less than 10.

The shield member comprises an electromagnetic-shielding electrically conductive material.

Each shield member may be in the form of a partial or complete Faraday cage. In examples, the shield member does not therefore couple with or enhance the magnetic field created by the antenna.

It may be that the shield member is made from non-ferromagnetic material. In examples, the shield member is formed of non-ferritic stainless steel.

It may be that during plasma generation the shield member is held at a fixed potential, for example being grounded. The shield member may be electrically connected, via a low impedance path, to ground.

The at least one shield member may comprise dielectric material. In examples, the shield member is made from $Al_2O_3$ (i.e. alumina).

As mentioned above, at least a portion of the electrical conductor of the antenna may include or be provided with a cover of (or comprising) dielectric material, having certain preferred thermal properties for example. The cover may optionally act as a shield, as described above.

For example, the dielectric material may comprise a nitride, for example one or both of silicon nitride and aluminium nitride.

The dielectric material (and/or the cover) may have an electrical resistivity of at least $10^{15}$ Ωcm.

The shield may comprise a coating or cover member, such as those described above. The shield may comprise a coating formed on the electrical conductor of the antenna. There may be one or more interlayers between the electrical conductor and the coating. The one or more interlayers may comprise an adhesion layer for facilitating the attachment of the coating to the electrical conductor. The coating may have a mean thickness of at least 100 microns. The coating may have a mean thickness of less than 2.0 mm. It is preferred for at least 95% by area of the coating to have a minimum thickness of at least 100 microns, optionally at least 200 microns. It is preferred for at least 95% by area of the coating to have a thickness of less than 2.0 mm, possibly less than 1.5 mm.

It may be that the thermal expansion co-efficient of the coating is no more than 50% of the thermal expansion co-efficient of the electrical conductor of the antenna. The antenna may be cooled during use, for example by a liquid coolant. The plasma antenna may be configured to be liquid-cooled. In examples, there is a lumen for a receipt of cooling liquid for use in cooling the plasma antenna.

In use, the antenna creates a magnetic field. As mentioned above, a ferromagnetic/ferrimagnetic material may be arranged to partially surround the antenna, for example to increase the magnetic flux density in a plasma generation region. The magnetic field in a plasma generation region may be enhanced and/or focussed by a plasma focussing member, which comprises ferromagnetic/ferrimagnetic material. Such ferromagnetic/ferromagnetic material may have a relative magnetic permeability (i.e. the ratio of the material's permeability to the permeability of free space) of greater than 25, preferably greater than 100, optionally greater than 250, and possibly 500 or more. The material may be a ferrite.

The plasma antenna assembly may comprise a shielded antenna section in which a ferromagnetic or ferrimagnetic shielding member fully surrounds a length of the antenna. In particular, the ferromagnetic or ferrimagnetic material of the focussing member may also be formed into a shielding member which fully surrounds a length of the antenna. The ferromagnetic or ferrimagnetic shielding member may be provided in the housing. The ferromagnetic or ferrimagnetic shielding member may be integral with the ferromagnetic or ferrimagnetic focussing member. In said shielded antenna section, the antenna may be aligned with a central longitudinal axis of the housing.

The ferromagnetic or ferrimagnetic shielding may be used at one or more end regions of the antenna where plasma generation is not required. A straight section of the housing may thereby comprise a generally crank-shaped length of antenna, whereby at the end sections the antenna is aligned with a central longitudinal axis of the housing and completely surrounded by ferromagnetic or ferrimagnetic material for shielding, and in the middle region the antenna is offset from a central longitudinal axis of the housing and partially surrounded by the ferromagnetic or ferrimagnetic material for focussing.

In examples, a high density plasma is created. Thus, at least some portions of the plasma may have a density of greater than $10^{11}$ cm$^{-3}$. The volume of plasma generated having a density of greater than $10^{11}$ cm$^{-3}$ may be greater than 10 cm$^3$ and may be greater than 500 cm$^3$.

The method may include confining (for example shaping) and/or directing the plasma onto or towards a particular location or region, for example onto a target in a processing chamber. Electric and/or magnetic fields may be used to actively confine/direct the plasma. The antenna may have one or more shielding material/members and/or field focussing material/members and/or field enhancing material/members, which in use act to confine/direct the plasma.

There may be one or more magnets provided, for example separately from the plasma antenna. Such magnet(s) may be configured such that the plasma is confined and/or propagated in an orthogonal direction relative to the length of the antenna, for example across a process chamber. In the case where the antenna is at least partially located in a process chamber, one of the one or more magnets may also be located within the process chamber. The magnet(s) can be positioned within the process chamber in order to reduce the foot print of the apparatus. Furthermore, the magnets can be manipulated within the space of the process chamber to tune, focus, confine and/or direct the plasma formation. Thus, the plasma can be generated and shaped/confined so that it is in the correct form as necessary for the process chamber.

The one or more magnets may be used to confine, shape and/or propagate the plasma generated by the antenna/antennae as a linear plasma, for example across a process chamber, optionally so as to take the form of a sheet or slab of thin plasma originating from the antenna. This is in contrast to inefficient large area plasma processing apparatus of the prior art where many antenna and magnets are arranged to create an unfocused plasma cloud or beam that can brought into contact with a process surface or target. It may be that the plasma is both magnetised at an appropriate level and that the magnetic field is orientated relative to the antenna such that the RF power applied by the antenna is propagated over a far greater spatial extent than is usual in other plasma generating systems. It has been surprisingly found that the plasma of embodiments of the present invention can be manipulated with a magnetic field strength as low as 4.8 Gauss, which is an order of magnitude less than the operating regions of the prior art (50-200 Gauss). The manipulation of the plasma by use of a much lower magnetic field strength allows the use of multiple plasma sources within a single process chamber without detrimental or unintended cross plasma source interference, allowing multiple simultaneous plasma processes to be conducted in the same process chamber.

In examples, the plasma is shaped by one or more magnets. In examples, there is a single plasma source generating the sheet of plasma. In such a case, the plasma may have a substantially uniform density along the entire length of the antenna. This is in contrast to the multi-antenna inductively coupled plasma of the prior art that requires multiple tuned antenna and magnets to carry out wide-area plasma processing An aspect of the invention relates to a method of depositing a material on a substrate, for example by sputter coating. The method may comprise a step of generating plasma (e.g. a volume of inductively coupled plasma) using an antenna in accordance with any aspect of the invention as claimed or described herein, possibly including any of the optional features mentioned herein relating to such a plasma antenna or plasma antenna assembly. There may be a step of generating a sputtered material from the one or more sputter targets using the plasma so generated. Such sputtered material may then be deposited onto a substrate. The step of generating the plasma may be performed such that the plasma is generated remotely from one or more sputter targets. The substrate may be a flexible substrate. The method may include a step of propagating and/or confining the plasma as a sheet of plasma. The step of depositing the sputtered material onto the substrate may result in crystalline material being formed in situ, as the material is deposited.

The sputtered material deposited onto the substrate may comprise semiconducting material. The method may be performed a plurality of times in order to deposit multiple layers.

The step of generating sputtered material from the target or targets using the plasma may include confining and/or directing the plasma onto a target, for example with the use of an electric field and/or a magnetic field. The plasma may be so shaped and confined so as to form a sheet of plasma, for example a sheet that extends in a direction along the width of a substrate and in a direction along the length of the substrate. The plasma may have a substantially uniform density at the target as a result, for example, at least in part, of the use of the at least one shield member.

In examples, the plasma is generated, maintained and shaped in a working space of a process chamber, and is not generated in a separate, discrete, or non-integrated plasma chamber (usually referred to as a discharge tube), which is subsequently drawn into the working space of the process chamber, as seen in the systems of the prior art. Thus, at least a part of the plasma source (for example the antenna or optionally its housing or a part thereof) may form an integral or integrated element of the process chamber, without the necessity of the housing or antenna being surrounded by a plasma chamber, or the housing itself being part of a plasma chamber. In contrast, certain examples of the present invention generate and maintain the high density plasma in the gaseous medium of the process chamber. It has been found that, in certain examples, it may be adequate merely to house or enclose the antenna itself within the process chamber, thus greatly simplifying the design requirements of a plasma processing apparatus.

It may be that there is provided a sputter coating apparatus for sputtering a sputter material from a sputter target onto a substrate, the sputter coating apparatus comprising an antenna in accordance with any aspect of the invention as claimed or described herein, possibly including any of the optional features mentioned herein relating to such a plasma antenna or plasma antenna assembly. There may be a process chamber which is arranged to receive a sputter target and a substrate. One or more magnets may be configured to confine and propagate the plasma onto one or more sputter targets.

A further aspect of the invention relates to a plasma reactor comprising one or more plasma antennae in accordance with any aspect of the invention as claimed or described herein, possibly including any of the optional features mentioned herein relating to such a plasma antenna or plasma antenna assembly.

The plasma antenna may be configured to generate an inductively coupled plasma. In alternative embodiments, the plasma antenna may be configured for operation in a Helicon coupled mode. The plasma reactor may be configured to operate at least partially in a Helicon coupled mode. The plasma antenna may be configured to generate a wave-heated plasma. Some aspects of the present invention may have application in relation to generating a capacitively couple plasma.

The plasma antenna may be configured to generate a plasma remote from a sputter target.

The plasma reactor may comprise a process chamber.

A yet further aspect of the invention relates to a process chamber configured for generating plasma with the use of a plasma antenna in accordance with any aspect of the invention as claimed or described herein, possibly including any of the optional features mentioned herein relating to such a plasma antenna or plasma antenna assembly.

It will be appreciated that in use, the plasma antenna or one or more portions thereof, is configured to excite a gaseous medium thereby generating a plasma. Such a plasma may for example be generated within the process chamber along the length of the antenna. In examples, the plasma can be generated along the entire length of an antenna within the processing chamber. The antenna may be housed at least partially within a housing, for example a tube, as described herein. The housing may be sealed from the interior of the chamber.

A further aspect of the invention relates to an apparatus, for example a deposition apparatus, comprising one or more plasma antennae in accordance with any aspect of the invention as claimed or described herein, possibly including any of the optional features mentioned herein relating to such a plasma antenna or plasma antenna assembly. The apparatus may comprise a process chamber. The process chamber may include a process surface. Plasma may be propagated and/or confined, for example as a sheet of plasma, by the magnetic field in a direction which is generally parallel with the process surface. For example, one or more magnets may be configured to confine and propagate the inductively coupled plasma to a location in the process chamber that is remote from the plasma source.

The apparatus may comprise a housing arranged to separate the antenna from the plasma generated by the antenna.

A yet further aspect of the invention relates to an electronic device comprising a component which comprises a layer of material deposited using the method of any aspect of the invention as claimed or described herein, possibly including any of the optional features mentioned herein. The component may include the substrate onto which the layer of material has been deposited.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
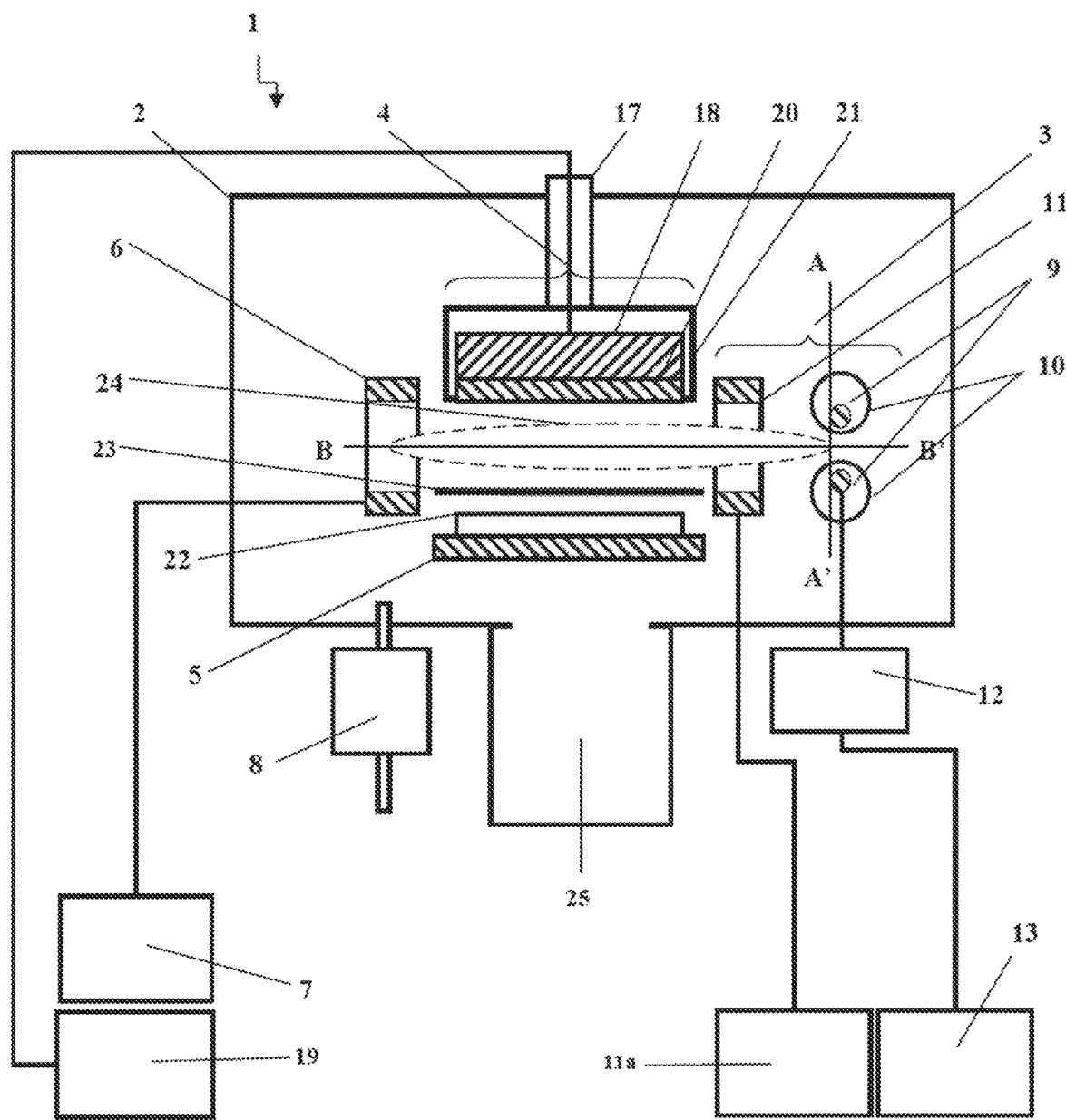
FIG. 1 is a schematic longitudinal cross section of a sputter deposition system which incorporates a plasma generating apparatus according to embodiments of the present invention.

Details of methods, apparatus, systems, structures, and devices of embodiments of the present invention will become apparent from the following description, with reference to the Figures.

The present embodiments all concern or relate to plasma generation.

Certain embodiments relate to a plasma reactor comprising a process chamber, a plasma antenna assembly configured to generate a volume of plasma in the process chamber, and one or more magnets configured to confine and/or propagate the plasma to a location in the process chamber that is remote from the plasma antenna assembly; wherein the plasma antenna assembly comprises: a radio frequency (RF) antenna arranged to be driven by a current so as to generate the plasma in a plasma generation region, a housing arranged to separate the antenna from the plasma generated in the plasma generation region, and a ferromagnetic or ferrimagnetic focussing member is arranged to partially surround a length of the antenna.

Certain embodiments relate to a plasma antenna assembly for use in a plasma reactor, the plasma antenna assembly comprising: a radio frequency (RF) antenna arranged to be driven by a current so as to generate plasma in a plasma generation region, a housing arranged to separate the antenna from the plasma generated in the plasma generation region, a ferromagnetic or ferrimagnetic focussing member is arranged to partially surround a length of the antenna so as to increase the magnetic flux density in the plasma generation region, and shielding arranged to shield the focussing member from magnetic fields generated externally to the plasma antenna assembly.

Certain embodiments relate to a method of generating a plasma with the use of a plasma antenna having a length, the method including driving an electrical conductor of the plasma antenna with RF frequency current to generate plasma both at a first location and at a second location spaced apart from the first location in a direction along the length of the antenna, there being a region adjacent to the antenna between the first location and the second location at which the generation of plasma is restricted and/or curtailed and/or inhibited as a result of at least one shield member.

Certain embodiments relate to a plasma antenna assembly, the assembly comprising an antenna and a housing, wherein the antenna has a length, the antenna is configured, when powered by RF frequency current, to generate plasma both at a first location and at a second location spaced apart from the first location in a direction along the length of the antenna, and the housing has at least one shield member which is arranged such that there is a region adjacent to the antenna between the first location and the second location at which, in use, the generation of plasma is restricted and/or curtailed and/or inhibited as a result of said at least one shield member.

Certain embodiments relate to a plasma antenna assembly comprising an antenna comprising an electrical conductor for generating plasma when driven by RF current, at least a portion of the electrical conductor being provided with a cover comprising a dielectric material, the cover having a mean thickness of at least 20 microns, a thermal conductivity of at least 5 W/m·K and a thermal expansion co-efficient of no more than $50 \times 10^{-6}$/K.

Certain embodiments relate to a plasma antenna assembly comprising an RF antenna comprising an electrical conductor for generating plasma when driven by radio frequency current, at least a covered portion of the electrical conductor being provided with a cover member comprising dielectric material, the cover member being held in spaced relationship to the electrical conductor, a first portion of the electrical conductor of the antenna extending beyond a first end of the cover member.

Certain embodiments relate to a plasma antenna arrangement in a plasma reactor, the plasma antenna arrangement comprising an antenna comprising an electrical conductor for generating a plasma when driven by radio frequency current, at least a covered portion of the electrical conductor being provided with a cover member comprising a dielectric material, a first portion of the electrical conductor extending beyond a first end of the cover member, wherein the covered portion of the electrical conductor provided with the cover member is exposed to ambient conditions in the plasma reactor, the first portion of the electrical conductor being isolated from the ambient conditions in the plasma reactor.

Figure 2:
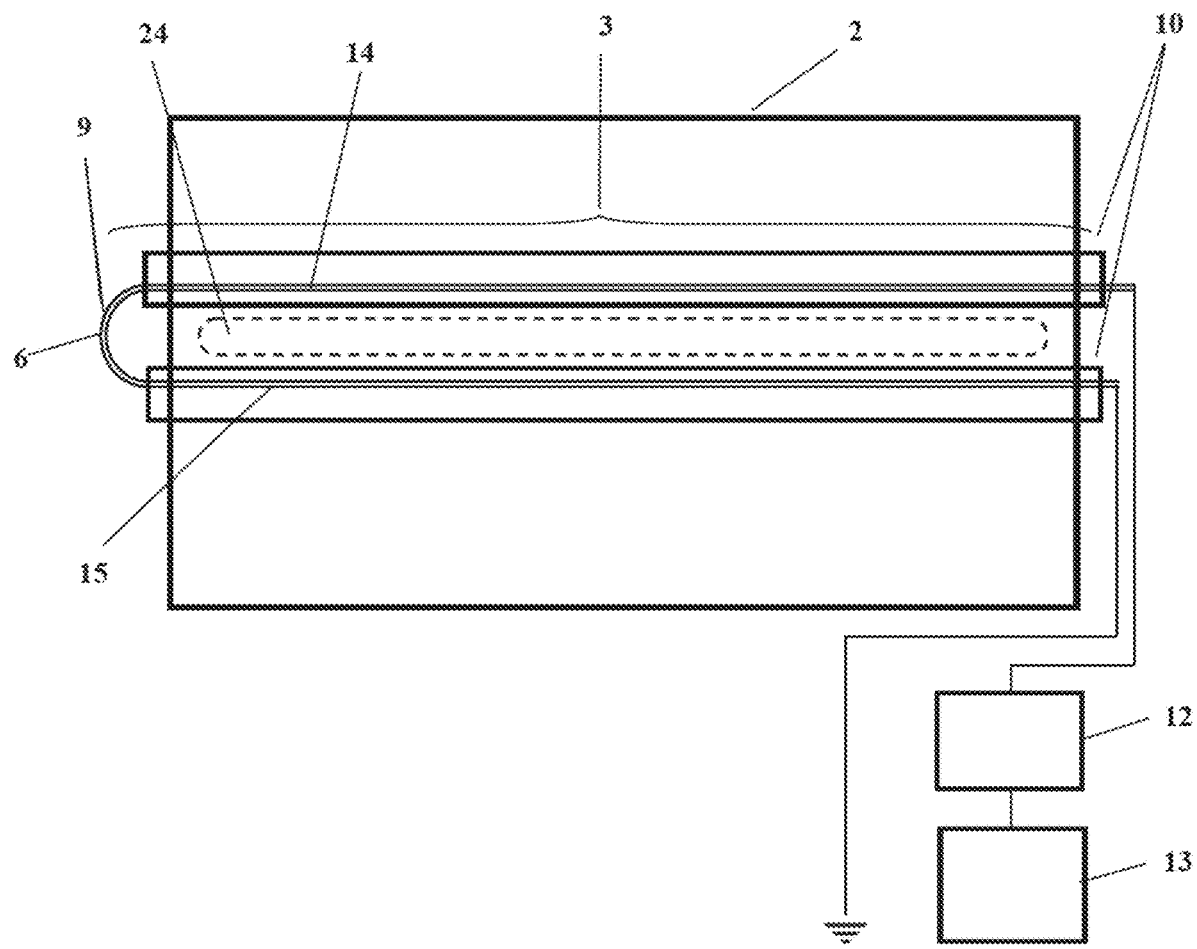
FIG. 2 is a transverse schematic sectional view of the apparatus of FIG. 1 taken about plane A-A' as viewed from the left hand side of FIG. 1.
Figure 3:
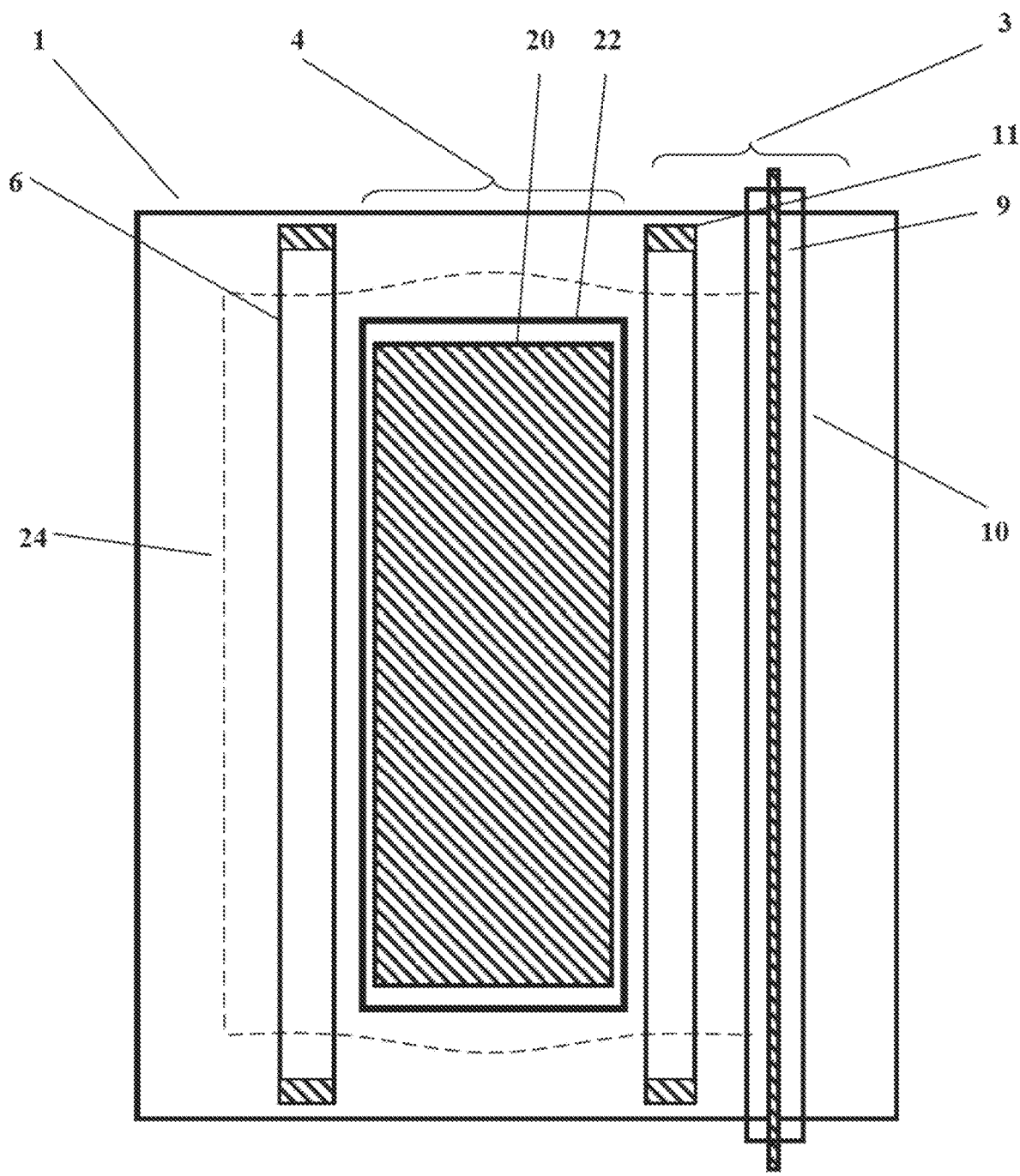
FIG. 3 is a schematic sectional view of the apparatus of FIG. 1 taken about plane B-B' as viewed from the bottom of FIG. 1, FIGS. 4 to 6 each show different types of plasma antennae for use in the apparatus of FIG. 1.

A plasma generating apparatus 1 which is utilised in embodiments of the invention is shown in FIGS. 1 to 3.

The plasma generating apparatus 1 comprises a process chamber 2, a plasma generation system 3, a target assembly 4, a substrate assembly 5, a magnet 6 with associated power supply 7, and a process gas feed system 8.

The process chamber 2 is, in its simplest form, a sealed box which at least includes the plasma generation system 3, the target assembly 4 and the substrate assembly 5. As shown in FIG. 1, the plasma generation system 3 and the substrate assembly 5 are located proximate each other in the process chamber 2. Since the plasma generation system 3 and the substrate assembly 5 are in the same chamber space (i.e. no separate plasma chamber for generating a plasma), the process chamber 2 can be said to be divided into a localised plasma generation zone (including the plasma generation system 3), and a processing zone (including at least one of the target assembly 4 and/or the substrate assembly 5). In the specific assembly shown in FIGS. 1 to 3, the process chamber 2 also houses the magnet 6.

The plasma generation system 3 is located in in the process chamber 2 within the plasma generation zone and shown in more detail in FIGS. 2 and 3. The plasma generation system 3 comprises an antenna 9, a housing 10, and an electromagnet 11. The plasma generation system 3 is connected to an impedance matching network 12, and a signal generator 13. In contrast to prior art examples of process chambers, where plasmas are generated within contained plasma generation systems and then drawn out into the processing chamber, the plasma generation system 3 of the present invention resides within and is open to the same space of process chamber 2 where the plasma will be applied in processing of a target assembly 4 and/or substrate assembly 5. In other words, the plasma is generated locally in the atmosphere of the process chamber 2.

The antenna 9 is shown as a single looped wire which extends through the process chamber 2 in two straight sections 14, 15 which are connected by a curved portion 16 outside of the process chamber 2. The straight sections 14, 15 are offset in the process chamber 2 to induce plasma excitation in the region between the straight sections 14, 15 of the antenna 9. The antenna 9 is constructed from shaped metallic tubing (e.g. copper tube), although alternate electrically conducting materials, for example brass or aluminium or graphite, could be used, as can differing cross sectional shapes, for example rods, strips, wire or a combined assemblies. In an embodiment of the invention, the antenna 9 is selected so that it can deliver RF frequency in the process chamber 2.

The housing 10 encloses and isolates the antenna 9 from the process chamber 2. The housing 10 comprises elongate tubes with a defined inner space or internal volume. The housing 10 extends through the process chamber 2 such that the tubes connect with the walls of the process chamber 2. The housing 10 is provided with suitable vacuum seals around the ends of the housing 10 and the walls of the process chamber 2, such that the internal volume is open to atmosphere at one or both ends as shown in FIGS. 2 and 3.

The means of support and achieving vacuum seals and air cooling are omitted from the Figures for the sake of clarity.

The housing 10 is at least in part transparent to the radiation frequencies that are emitted from the antenna 9. The transparency of the housing 10 allows for the generation of plasma within the process chamber 2.

The housing 10 is a quartz tube, typically of wall thickness 2 to 3 mm. The housing 10 is of sufficient thickness such that the internal volume is open to atmospheric air, or a fluid flow can be passed through the internal volume to help with cooling the antenna. However, in an alternative embodiment the wall of the housing 10 may be thinner and as such unable to support a substantial pressure differential between the process chamber 2 and the internal volume of the housing 10. In this alternative embodiment the housing 10 may need to be evacuated to balance the differences in pressure within the process chamber 2 and within the internal volume of the housing. It would be understood that a vacuum pumping system would need to be fitted or attached to the housing 10 to evacuate the internal volume in which the antenna 9 resides to a pressure that also suppresses plasma generation within the internal volume of the housing 10 rather than generating plasma within the process chamber 2.

The electromagnet 11 is positioned proximate the antenna 9 and the housing 10 and is capable of producing an axial magnetic field strength of from 4.8 Gauss up to 500 Gauss when powered by its associated power supply 11a (e.g. a DC power supply). The electromagnet 11 provides a magnetic field within the process chamber 2 for propagating, or otherwise confining or shaping, the plasma generated by the plasma generating system 3 so that it extends or moves from the plasma generation zone to and across the processing zone of the processing chamber 2.

The plasma generating system 3 also includes means to support, align and position the antenna 9, housing 10 and electromagnet 11 within the process chamber 2 to enable the tuning of the plasma generation and propagation. In addition the impedance matching network 12, and the signal generator 13 can be powered to specific frequencies for more efficient plasma generation.

The target assembly 4 resides within the processing zone of the processing chamber 2, and comprises a process chamber feedthrough 17 that feeds cooling water and electrical power to a mounting assembly 18, the target assembly 4 is capable of being water cooled and having a voltage applied to it from a power source 19 external to the process chamber 2. A target material 20 is fitted to the face of the mounting assembly 18 that faces the substrate assembly 5, ensuring good electrical and thermal contact by well-known means, for example bonding with silver loaded epoxy. Additionally in order to prevent sputtering of the mounting assembly 18 a shield 21 that is electrically grounded is provided around this item, allowing only the target material 19 to be directly exposed to the plasma.

The substrate assembly 5 essentially provides a means to position and hold a one or more substrate(s) 22 that are to be coated within the process chamber 2. The substrate assembly 5 may be water cooled or include heaters to control the substrates 22 temperature, be capable of having a voltage applied to it to assist control of deposited film properties, include means of rotating and/or tilting the substrates 22 to improve coating thickness uniformity, and itself be capable of being moved and/or rotated within the process chamber 2. A moveable shutter assembly 23 is provided such that in the 'closed' position target sputtering can take place without coating the substrates 22. The moveable shutter assembly 23 may be replaced with a fixed set of shields that define a coating aperture under which the substrate assembly 5 is translated so as to coat the substrates 22. For an appropriate substrate type and material the substrate assembly 8 may not be required.

In the apparatus shown in FIGS. 1 to 3, the target assembly 4 and the substrate assembly 5 are positioned and arranged in two parallel planes within the process chamber 2. These planes are common with the extending direction of the antenna 9 and housing 10 through the process chamber 2.

In an alternate embodiment of the target assembly 4, the single target material 20 may be replaced by two or more differing target materials, such that a coating of material on the substrate 22 that is a composite mixture, alloy or compound of the differing individual materials may be formed. Individual target materials may be separately electrically biased; this may be of use in cases where one or more of the targets will be biased by RF power and it is desired to prevent RF power induced low intensity plasma generation and sputtering of the other target materials that might contaminate the process. In an alternative arrangement, the target assembly 4 may be separately electrically biased by pulsed DC & DC Bias. Additionally or alternatively, the target material 20 and mounting assembly 18 may be constructed to be of different shapes, optionally with one or more targets which are moved (e.g. rotated) in order, for example, to maximise the target material lifetime by essentially providing an increased surface area to be sputtered.

In a further alternative embodiment of the target assembly 4, the target shield 21 is extended to cover the whole length of the target material 20 and mounting assembly 18 and includes apertures at various locations that thereby allow the plasma to interact with and sputter the target materials 20 only at those locations, thereby limiting and defining the target regions to be sputtered. This embodiment is especially useful when combined with a target comprising several target materials 20 as previously described as it is able to reduce cross-contamination of the materials at the substrates.

The magnet 6 is placed proximate to the target assembly 4 and the substrate assembly 5 and inside the processing zone of the process chamber 2. The magnet 6 is arranged away from the plasma generation system 3 and can be said to be arranged opposite to the plasma generation system 3 relative to the target assembly 4 and the substrate assembly 5. The magnet 6 and electromagnet 11 can be powered by their respective power supplies 7 and 11a to produce a magnetic field of strength approximately of from 4.8 Gauss and up to 500 Gauss between them and across the process chamber 2.

The process gas feed system 8 comprises one or more gas inlets for one or more process gases (e.g. Argon) or process gas mixtures, each gas flow being controllable for example using commercial mass flow controllers, and optionally including gas mixing manifolds and/or gas distribution systems within the vacuum chamber. A single gas inlet is provided to the vacuum chamber, the process gas or gases then being distributed to all parts of the process chamber 2 by normal low pressure diffusion processes or directed pipework.

In use, the plasma generating apparatus 1 generates and propagates a uniform plasma sheet 24 within the process chamber 2, without the need for a separate or enclosed plasma chamber.

Certain embodiments of the present invention concern features of the plasma generation system 3 and variations relating thereto, particular in relation to the arrangement of the antenna and/or its housing. FIGS. 4 to 7 concern one set of embodiments in this regard.

Figure 4:
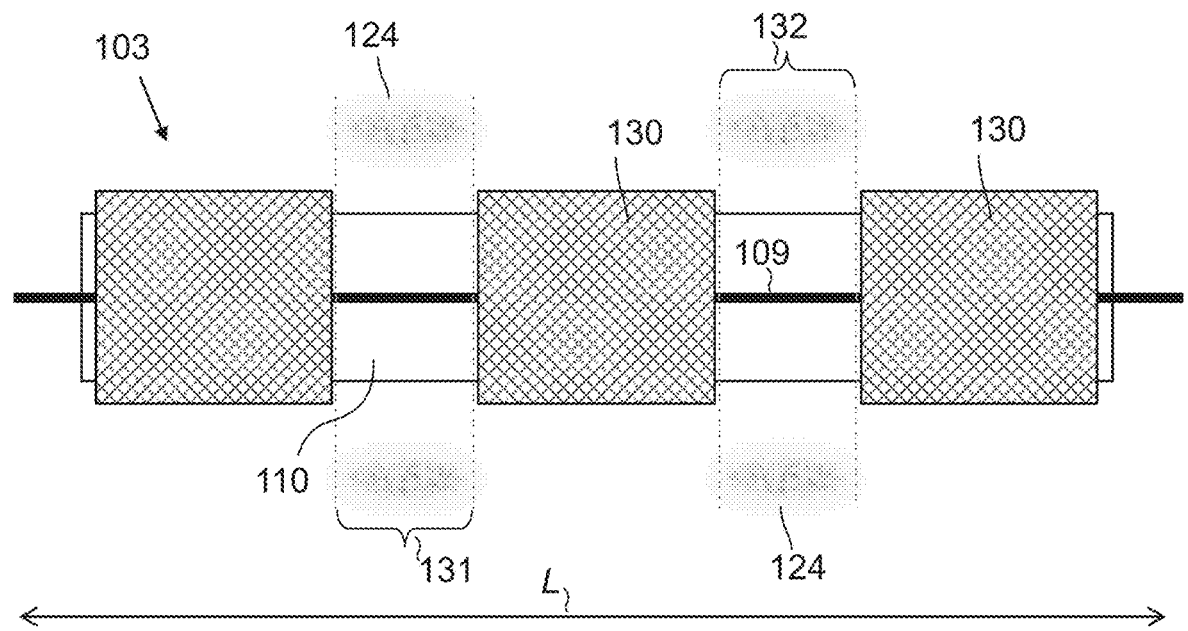

FIG. 4 shows a plasma generation system 103 comprising a plasma antenna 109, constructed from 6 mm diameter copper tube, enclosed in a quartz tube housing 110 of wall thickness 3 mm. The housing is shielded by three cylindrical shield members 130 which are spaced apart from each other along the length of the axis of the housing 110. Each shield member 130 is formed from a cylindrical cage of stainless steel material having an inner diameter slightly larger than the outer diameter of the housing 110. The shield members 130 are all electrically grounded by being connected to ground over a very low impedance path (which prevent the shield from acting as a rogue antenna). In use, each shield member 130 acts as an electromagnetic shield to restrict/block the electromagnetic wave emitted by the antenna. The varying electromagnetic field and therefore the plasma can be focussed/concentrated in particular locations. By being able to control where plasma is generated (and where it is not) the efficiency of the system can be improved, by using energy to create plasma in only those locations/regions where it is needed. The plasma antenna shown in FIG. 4 has a first annular region 131 in which plasma 124 is generated and a second annular region 132 in which plasma 124 is generated (in the absence of any significant effect on the magnetic/electrical fields from other sources) which is at a location spaced apart from the location of the first region of plasma in a direction along the length, L, of the antenna. In the absence of any significant effect on the magnetic/electrical fields from other sources, the plasma generated at each of the first and second regions extends circumferentially around the antenna (i.e. all 360 degrees around) in a relatively uniform manner. In other embodiments, and/or in the presence of other sources of magnetic and electric fields, the plasma may be non-uniformly distributed around the circumference. The plasma may for example effectively be distributed around part only of the circumference, as a result of the effect of other sources of magnetic and electric fields.

It will be seen that the shield members include one which prevents (or at least restricts) the generation of plasma at the region adjacent between the first and second regions 131, 132. The other two shield members include one to the left side of FIG. 4, which restricts the generation of plasma at the region to the left of the first region of plasma (i.e. at a region that is on the opposite side of the first region 131 from the second region 132) in the direction along the length, L, of the antenna. There is a shield member on the right side of FIG. 4, which restricts the generation of plasma at the region to the right of the second region 132 of plasma (i.e. at a region that is on the opposite side of the second region 132 from the first region 132).

The cage of stainless steel, being electrically conductive, acts as a Faraday cage. The stainless steel used is non-ferritic stainless steel, such as austenitic stainless steel, which can have a relative magnetic permeability of less than 10. The shield member so formed by the cage of electrically conductive non-ferritic material is thus able to reduce the local magnetic field created by the antenna at certain regions.

In this embodiment, where the shield members are made from stainless steel, the shielding action may be provided as a result of the limited distance the RF waves can penetrate into a conductor (skin-depth). For most conductors this is less than 50 μm and therefore effective shielding can be provided without the requirement for bulky materials (the diagrams are not shown to scale). It may be that the RF will cause some energy to be coupled into the shield in the form of eddy currents in the conducting material. This should be minimised where achievable to improve system efficiency.

In the context of the present embodiments (utilising an inductively coupled plasma) capacitive coupling will typically be viewed as undesirable and should thus be minimized/reduced where possible. It is recognised however that in order initially to first strike the plasma, some capacitive coupling may be necessary. Capacitive coupling in the system may lead to charging up of insulated surfaces and subsequently to sputtering of these surfaces. Capacitive discharges are associated with much smaller ion densities. As the discharge gets more dense, the magnetic fields can couple efficiently to the free charges and can then create even more dense plasma, which makes it more and more difficult for the electric field to penetrate into the plasma volume.

In other embodiments, the shielding is implemented inside of the quartz tube.

Figure 5:
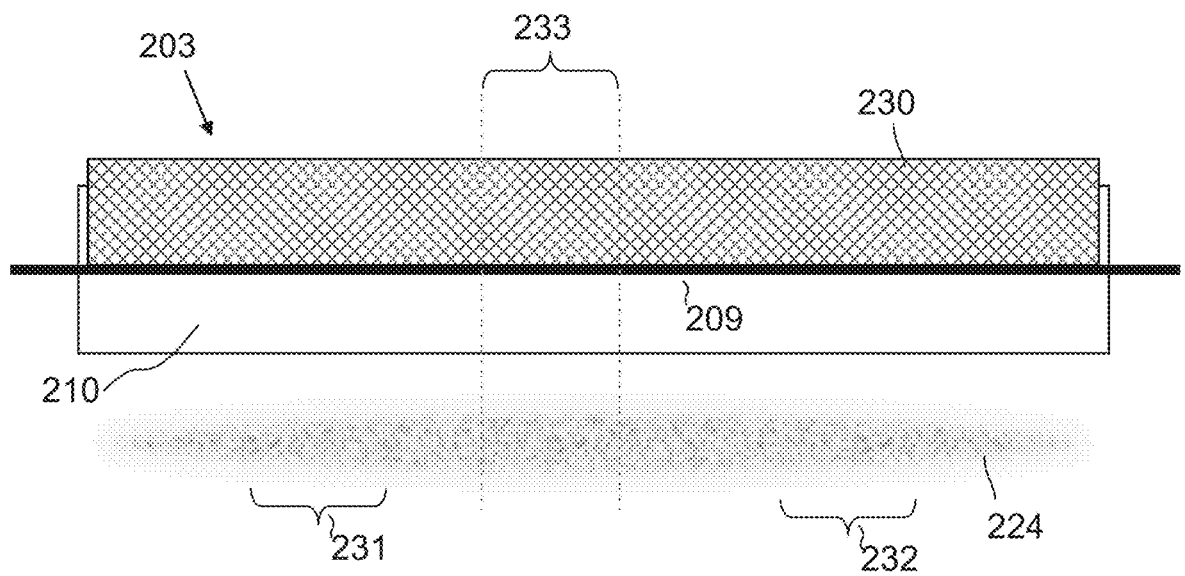

FIG. 5 shows an antenna plasma generation system 203 similar to that shown in FIG. 4. There is an antenna 209 enclosed in a quartz tube housing 210 with a steel shield member 230 which prevents plasma from being generated. The principal differences between the arrangement of FIG. 5, as compared to that of FIG. 4, will now be described. There is a single shield member 230 formed from a half cylinder of stainless steel material which extends circumferentially around the antenna for about 180 degrees. Thus, in the arrangement shown in FIG. 5 there is, along the length of the antenna, a first location 231 at which plasma 224 is generated and a second spaced-apart location 232 at which plasma 224 is also generated. At both locations, the plasma extends—in the absence of any significant effect on the magnetic/electrical fields from other sources—circumferentially around the antenna by about 180 degrees. Along the length, L, of the antenna between the first location 231 and the second location 232, there is a third location 233, in which plasma is also generated around about 180 degrees of the antenna. At each of the first, second and third locations along the length, L, of the antenna, there is also a portion of the shield member 230 which restricts the generation of plasma around the other 180 degrees around the antenna. The shield member (and the region in which plasma is generated on the opposite side of the antenna to the shield member) also extends to the left (as viewed in FIG. 5) of the first location 231 and to the right of the second location 232 of plasma.

Figure 6:
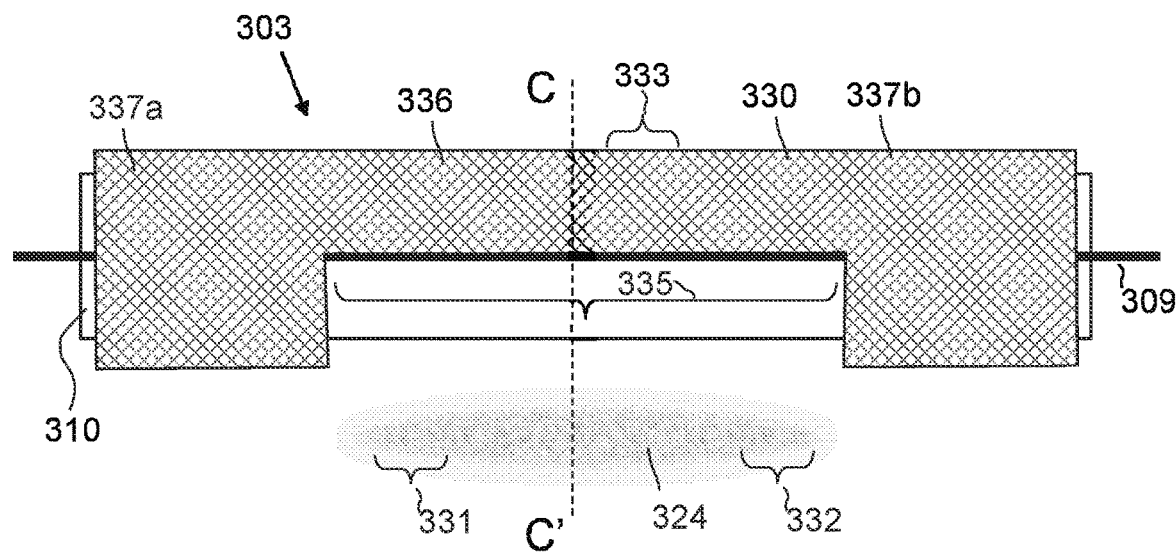
Figure 7:
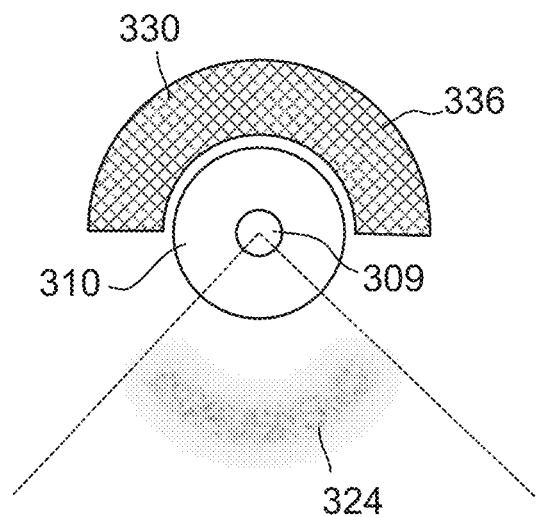
FIG. 7 shows a cross-section of the antenna shown in FIG. 6 taken across plane C-C'.

FIG. 6 shows an antenna plasma generation system 303 similar to that shown in FIG. 5. There is an antenna 309 enclosed in a quartz tube housing 310 with a generally cylindrically-shaped steel shield member 330 which prevents plasma from being generated at certain regions. The principal differences between the arrangement of FIG. 6, as compared to that of FIG. 5, will now be described. The single shield member 330 has a cut-out 335 such that the shield member has a middle portion 336 in the shape of half cylinder, which is disposed between two end portions 337a,b each being in the form of a full cylinder. FIG. 7 shows in cross-section (about plane C-C') the antenna 309 surrounded by its housing 310 and the middle portion 336 of the shield member 330. The middle portion 336 extends circumferentially around the antenna for about 180 degrees, whereas the two end portions 337a,b extend circumferentially around the antenna for the entire 360 degrees. Thus, in the arrangement shown in FIGS. 6 and 7 there is, along the length of the antenna, a first location 331 at which plasma 324 is generated and a second spaced-apart location 332 at which plasma is also generated. At both locations, the plasma extends—in the absence of any significant effect on the magnetic/electrical fields from other sources—circumferentially around the antenna by less than 180 degrees. Along the length, L, of the antenna between the first location 331 and the second location 332, there is a third location 333, in which plasma is also generated partially around the antenna. It will be seen from FIG. 7, that the plasma is present in a region which is confined within a sector of space (designated by the dashed lines meeting at the centre of the antenna axis) that extends circumferentially around approximately 90 degrees of the antenna. The centre of mass of the plasma is located further from the centre of the antenna axis (in the radial direction) than the outer diameter of the shield member.

At each of the first, second and third locations along the length, L, of the antenna, there is a portion of the shield member 330 which restricts the generation of plasma within a sector that extends circumferentially about 180 degrees around the antenna. The left end portion 337a of the shield member is positioned to the left (as viewed in FIG. 6) of the first location 331 and prevents plasma from being generated in the region of the left end portion 337a. Similarly, the right end portion 337b of the shield member is positioned to the right (as viewed in FIG. 6) of the second location 332 and prevents plasma from being generated in the region of the right end portion 337b and to the right of the second location 232 at which plasma is generated.

It will be appreciated that, in use, particularly when the plasma generated by an antenna is to be constrained, directed or otherwise manipulated for use in a process that requires the plasma to be present at a particular desired region remote from the plasma antenna, that there will be a need for other sources of magnetic/electrical fields to affect the shape and location of the plasma. As such, in use, the shape and location of the plasma will be non-uniform and/or will be different from shown in the accompanying Figures.

In other embodiments, the shielding is implemented inside of the quartz tube.

Figure 8:
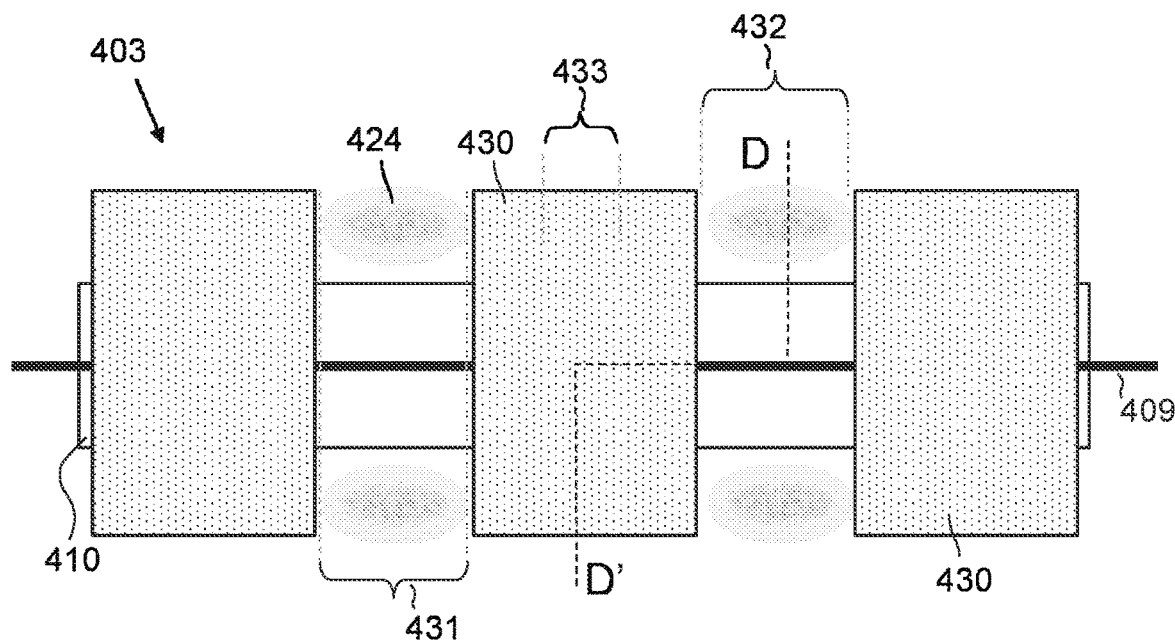
FIG. 8 shows a further type of plasma antenna for use in the apparatus of FIG. 1.
Figure 9:
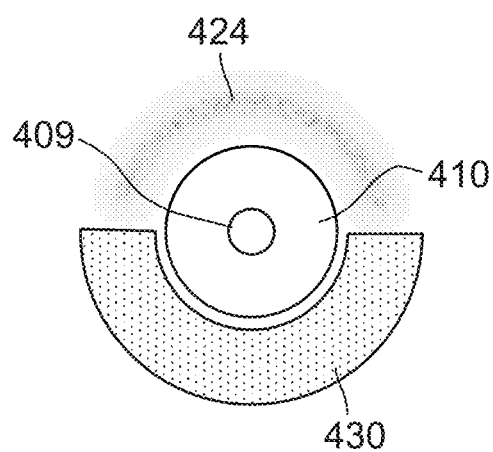
FIG. 9 shows a cross-section of the antenna shown in FIG. 6 taken across plane D-D'.

FIG. 8 shows a plasma generation system 403 similar to that shown in FIG. 4. There is an antenna 409 enclosed in a quartz tube housing 410 with three spaced apart shield members 430 which prevent plasma from being generated at three annular regions spaced-apart along the length of the antenna. A composite cross-section view, taken along the line D-D, is illustrated schematically by FIG. 9 which shows the antenna 409 surrounded by its housing 410. The bottom half of FIG. 9 shows a section of the shield member 430 at one longitudinal location and the top half of FIG. 9 shows the plasma as generated at a different longitudinal location. The principal difference between the arrangement of FIG. 8, as compared to that of FIG. 4, is that the shield members 430 are made from a dielectric material, such as alumina. It will be seen that the overall geometry of the shield members is similar to that of the FIG. 4 example, but that the shield members 430 of FIGS. 8 and 9 extend slightly further radially from the antenna. With the use of dielectric shield members, ignition of plasma is suppressed by the combined effect of attenuation of the electromagnetic waves in a dielectric material and the reduction of the field strength with distance from the source. In the arrangement shown in FIGS. 8 and 9 there is a first annular region 431 in which plasma 424 is generated and a second annular region 432 in which plasma 424 is generated (in the absence of any significant effect on the magnetic/electrical fields from other sources) which is at a location spaced apart (along the axis of the antenna) from the location of the first region of plasma. In the absence of any significant effect on the magnetic/electrical fields from other sources, the plasma generated at each of the first and second regions 431, 432 extends circumferentially around the antenna (i.e. all 360 degrees around) in a relatively uniform manner. The middle shield member 430 restricts the generation of plasma at a third region 433 between the first and second regions 431, 432. It will be seen from FIG. 9, that the entre of mass of the plasma 424 is located close to the centre of the antenna axis (in the radial direction) than the outer diameter of the shield member 430.

It will be appreciated that there is attenuation of the field strength with increasing distance from the antenna. In this embodiment, where the shield members are made primarily from dielectric material, the shield material's main function is to occupy the space near the antenna so that there is no (or insufficient) gas in that space or next to the antenna, which can strike a plasma and such that gas beyond the shield members (in the radial direction from the antenna) is at a region where the electric and magnetic fields have been sufficiently decreased to a level below that at which plasma ignition is likely to occur. To minimize any losses, the dielectric material used for the shield members will preferably have minimal interaction with the electromagnetic waves from the antenna.

It will be appreciated that geometries similar to those shown in FIGS. 5 and 6 (and other geometries) could be implemented with dielectric shield members instead of metal electrically conducting shield members.

Figure 10:
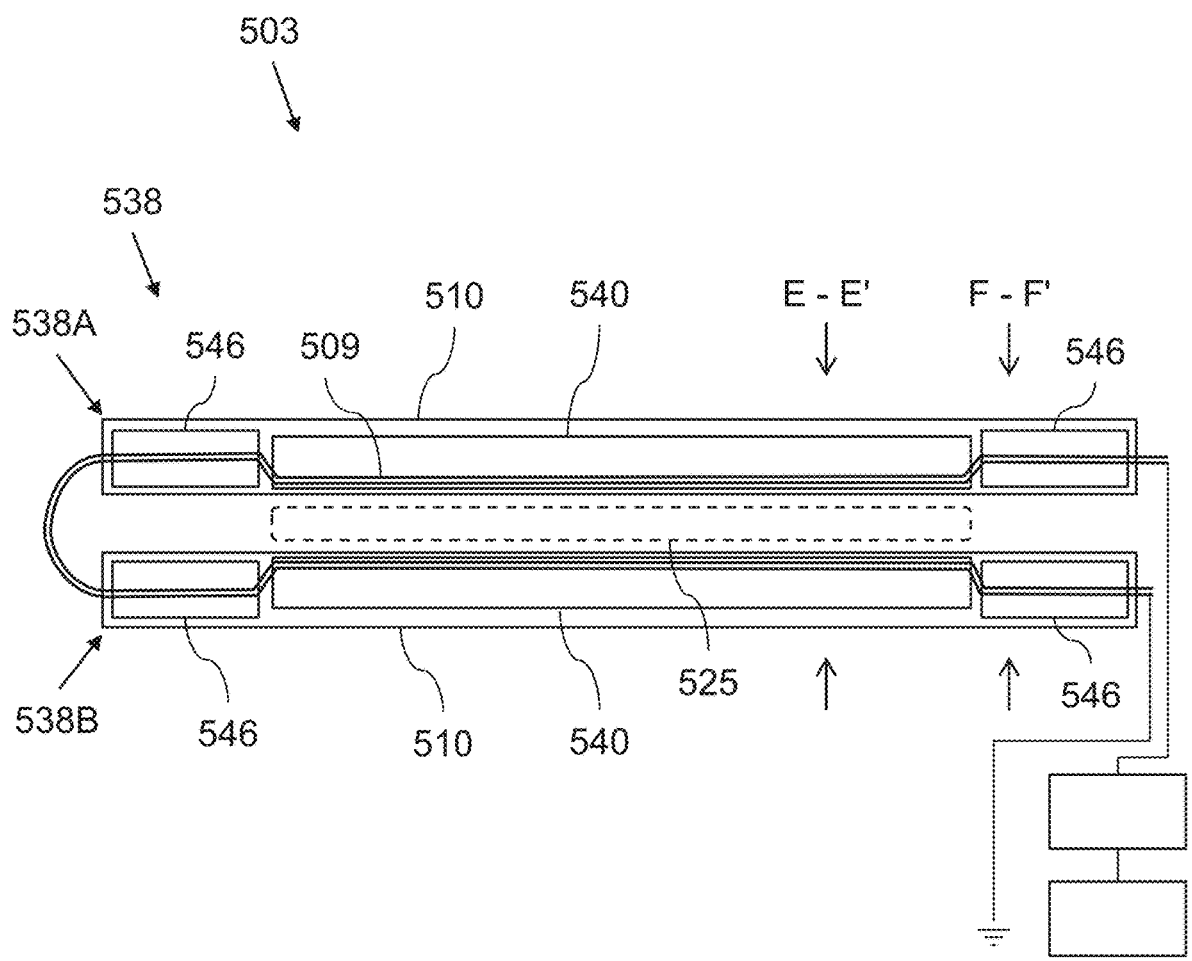
FIG. 10 shows a further type of plasma antenna for use in the apparatus of FIG. 1.

FIG. 10 shows a plasma generation system 503 according to an embodiment of the invention. The plasma generation system 503 comprises an antenna assembly 538 that comprises a straight upper section 538A and a straight lower section 538B. The longitudinal axes of the upper section 538A and lower section 538B are parallel and the ends of each section 538A, 538B are aligned.

The upper section 538A and lower section 538B each comprise a length of an RF antenna 509 constructed of a copper tube. The antenna 509 is looped around in a U-shape in the manner shown and so is common to both the upper section 538A and lower section 538B.

The upper section 538A and lower section 538B each comprise a quartz tube housing 510 that encloses the length of antenna 509 in that section. In the middle region of each section 538A, 538B, the lengths of antenna 509 are positioned proximate the wall of the housing 510 and are thereby offset from the longitudinal axis of the housing 510. The upper section 538A and lower section 538B each further comprise a ferrite focussing member 540. The focussing member 540 is also provided in the housing 510 and partially surrounds the length of antenna 509.

Figure 11:
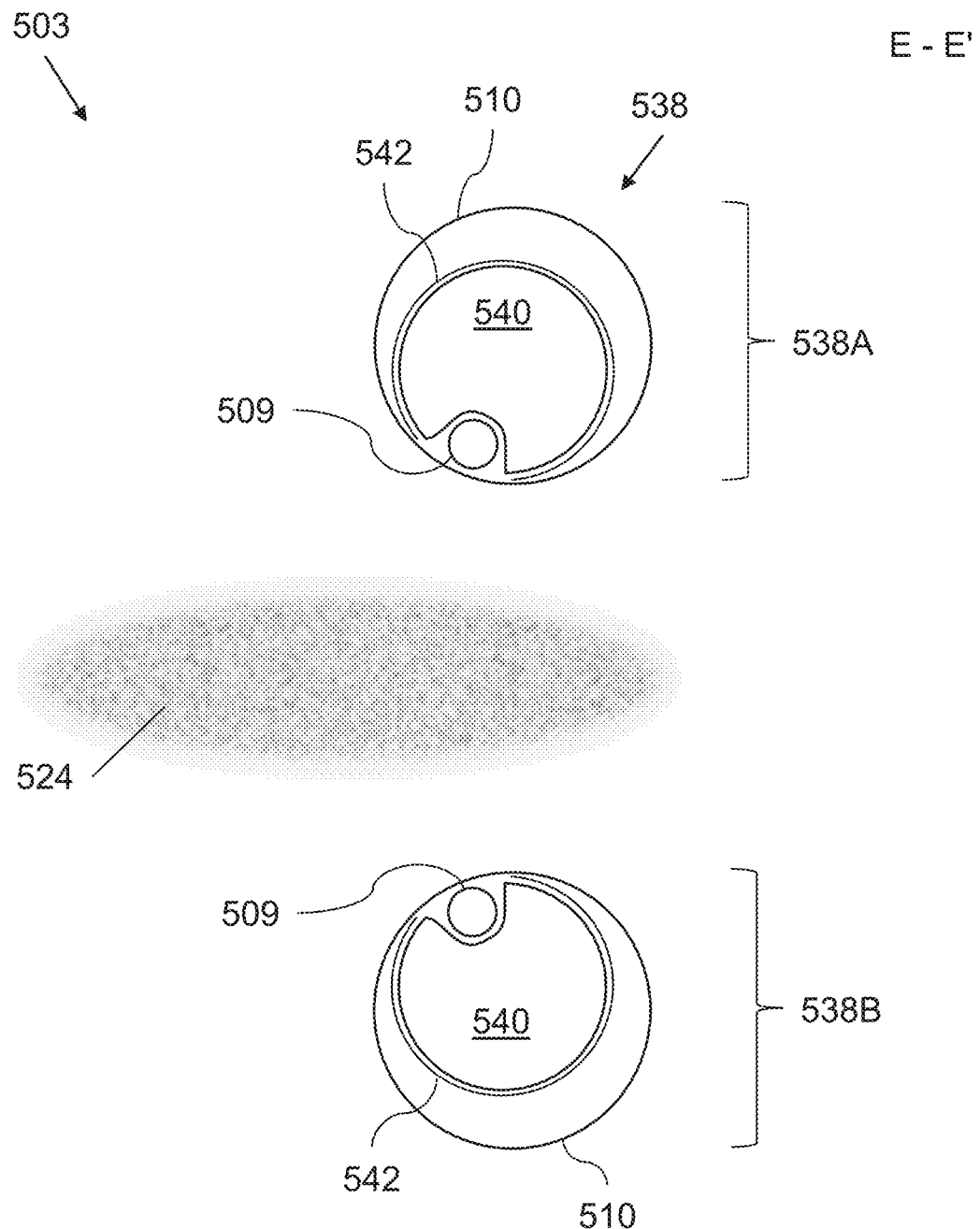
FIG. 11 shows a cross-section of the antenna shown in FIG. 10 taken across plane D-D'.

As shown in FIG. 11, the focussing members 540 have a generally C-shaped cross section, the antenna 509 being provided in the recessed part of the C-shape. The focusing member 540 and antenna 509 in the upper section 538A are arranged in mirror image to the focussing member 540 and antenna 509 in the lower section 538B, the open side of the focussing members 540 each facing generally inwards.

In use, the antenna 509 is driven by an RF current and generates a time-varying magnetic field. The magnetic field ionises gas outside the housing and an inductively coupled plasma 524 is generated in a plasma generation region 525 between the upper section 538A and lower section 538B.

The focussing members 540 each have the effect of increasing the magnetic flux density in the angular region in which the antenna 509 is unshielded from the wall of the housing 510 (i.e. is not surrounded by the focussing member 510/the focussing member 510 is open). The arrangement of both the focussing members 540 thereby act to increase the magnetic flux density in the plasma generation region 525.

As can be seen, in the upper section 538A the antenna 509 is provided in approximately a 7 o'clock position in the housing 510, and in the lower section 538B the antenna is provided in approximately an 11 o'clock position in the housing 510. In use in the plasma generating apparatus 1, this has the effect of moving the region of greatest magnetic flux density slightly towards the electromagnet 11.

The focussing members 540 also have the effect of reducing the magnetic field induced in the area above the upper section 538A and below the lower section 538B, and therefore less power is lost into these areas. The focussing members 540 thereby improve the efficiency of the plasma generation system as a whole. It will be appreciated that said increases and improvements are as compared to a similar antenna assembly in which the focusing members 540 are absent.

In order to take full advantage of the presence of the focussing members 540, the ferrite material of the focussing members 540 should preferably not be saturated by external magnetic fields (i.e. magnetic fields not generated by the antenna 509). In use in the plasma generating apparatus 1, such external magnetic fields may be generated by the electromagnet 11 that confines and propagates the plasma 524.

Accordingly, the focussing members 540 are each provided with a shield element 542 to shield them from such external magnetic fields. In this embodiment, the shield element 542 is in the form of a nickel alloy coating that is provided on the outwardly facing surfaces of the focussing member 540. An example nickel containing material that could be used is MuMetal® alloy by Magnetic Shield Corporation, Bensenville, Ill., USA.

In other embodiments, alternative or additional shielding may be provided. For example, parts of the housing 510 may be provided (e.g. coated) with shielding material, and/or one or more standalone shield elements may be provided in the region between the focussing member and the electromagnet 11.

The upper section 538A and lower section 538B, additionally have end regions, near which it is not required to generate plasma. In the end regions, the antenna 509 is positioned along (i.e. is coaxial with) the longitudinal axis of the housing 510.

Figure 12:
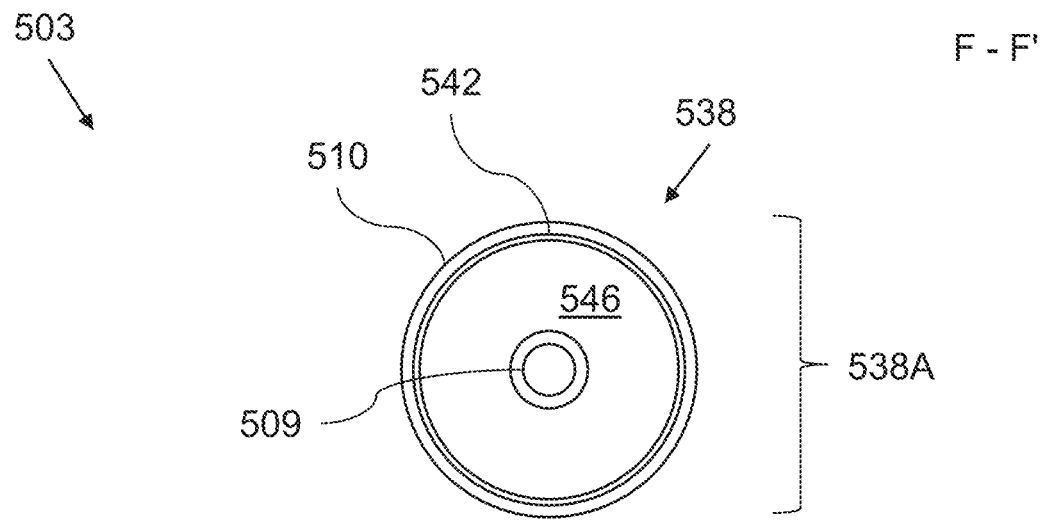
FIG. 12 shows a cross-section of the antenna shown in FIG. 10 taken across plane E-E'.
Figure 12:
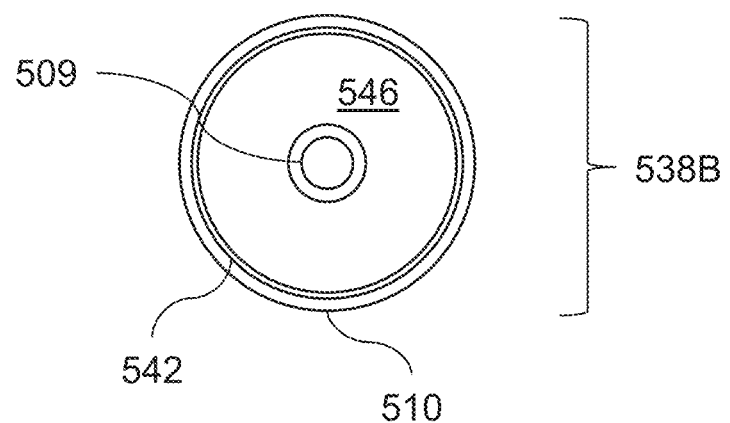

As shown in FIG. 12, ferrite material, which is the same ferrite material as which makes up the focussing members 540, forms a ferrite shield 546 that fully surrounds the antenna 509, thereby forming shielded sections of the plasma antenna assembly 538. As can be seen, the varying position of the antenna 509 in the housing 510 gives the antenna 509 a generally crank-shape in each of the upper section 538A and lower section 538B.

Figure 13:
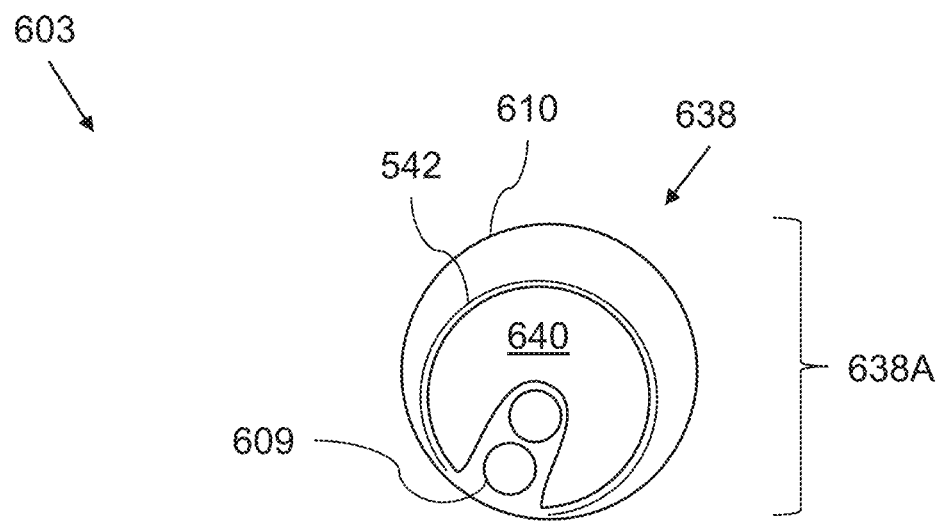
FIG. 13 shows a cross-section of a further type of plasma antenna for use in the apparatus of FIG. 1.
Figure 13:
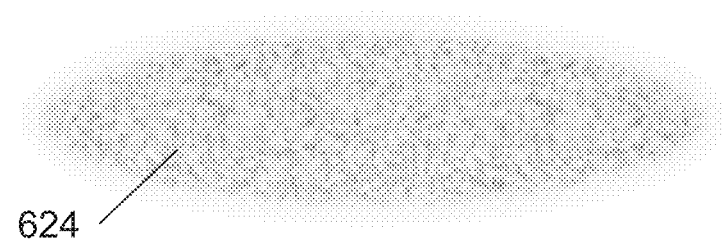
Figure 13:
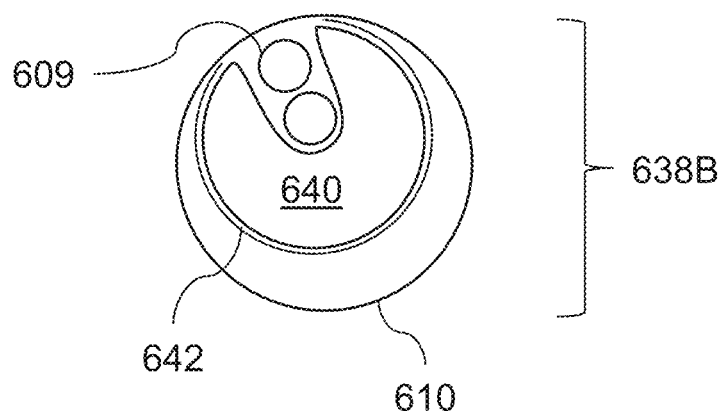

FIG. 13 shows an alternative embodiment, similar to the preceding embodiment, with like reference numerals denoting like parts. In this embodiment, the antenna 609 is looped around the plasma generation region twice. In this embodiment, the focusing members 640 in each of the upper and lower sections partially surround two lengths of the antenna 609. The lengths of the antenna 609 are positioned one behind the other as between the wall of the housing 610 and the longitudinal axis of the housing 610. The recess in each focussing member 640 is thereby deeper than, but has the same width as, in the preceding embodiment. In alternative embodiments, the lengths of the antenna are positioned differently within the housing. In an example alternative embodiment, the lengths of the antenna are both positioned proximate the wall of the housing. The recess in each focussing member is thereby shallower and wider than in the preceding embodiment.

A typical RF current used in plasma generation systems has a frequency of 13.56 MHz. When a plasma antenna assembly is used which comprises one or more ferrite focussing members, it can be beneficial to use a lower frequency of approximately 2 MHz, in order to reduce power loss to the ferrite itself.

Figure 14:
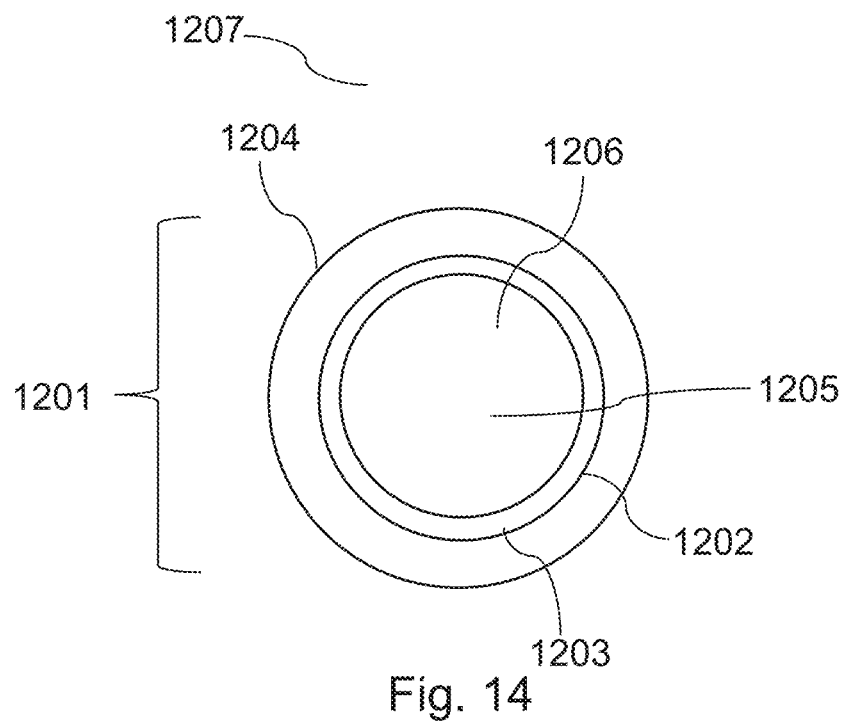
FIG. 14 shows a cross-sectional end view of an example of a plasma antenna assembly in accordance with an aspect of the present invention, with the electrical conductor of the antenna being coated with a dielectric material, the antenna assembly being suitable for use in the apparatus of FIG. 1.

FIG. 14 shows a cross-sectional end view of an example of a plasma antenna assembly in accordance with an aspect of the present invention. The plasma antenna assembly is denoted generally by reference numeral 1201, and comprises an antenna 1202 comprising an electrical conductor 1203 in the form of a copper coil. A cover 1204 in the form of a coating of silicon nitride is provided on the electrical conductor 1203. The antenna 1202 is provided with a lumen 1205 for the passage therethough of cooling fluid 1206, in this case water. The coating is approximately 2 mm thick.

The arrangement of FIG. 14 is advantageous in that the coating of dielectric material (silicon nitride) isolates the antenna's electrical conductor 1203 from the surrounding plasma. Furthermore, use of a silicon nitride coating inhibits the development of temperature gradients across the coating that may result in unwanted cracking of the coating. The build-up of such temperature gradients tends to occur at higher RF powers. In this connection, silicon nitride has a high thermal conductivity (about 20 W/m·K) and a low thermal expansion coefficient (about $3 \times 10^{-6}$/K).

Those skilled in the art will realise that other coating materials may be used. For example, aluminium nitride may be used, having a thermal conductivity of about 140-180 W/m·K and a thermal expansion coefficient of about $4.5 \times 10^{-6}$/K.

The coating material should preferably have a dielectric breakdown strength to withstand voltage drops of about 5 kV.

Those skilled in the art will realise that the plasma antenna assembly of FIG. 14 may be used with other aspects of the present invention. For example, the plasma antenna assembly of FIG. 14 may be used with ferrite material, as shown in FIG. 11, to focus the generation of plasma. Additionally or alternatively, the plasma antenna assembly of FIG. 14 may be used in combination with shields as described above with reference to FIGS. 4, 5, 6 and 8.

Figure 15:
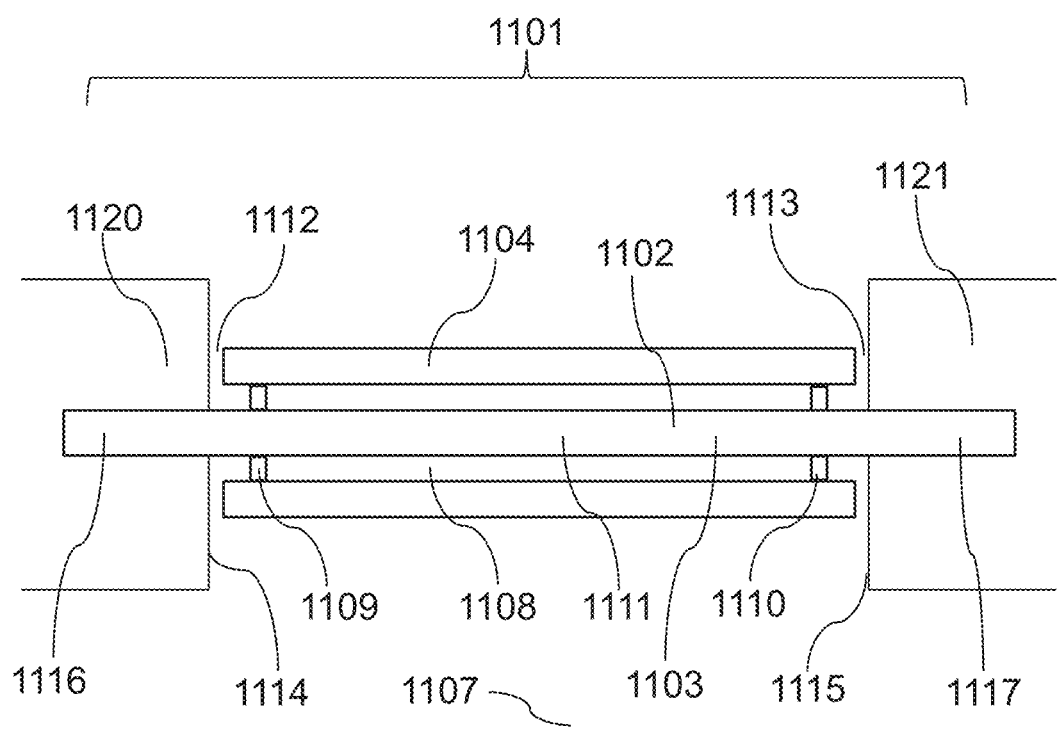
FIG. 15 shows a simplified, cross-sectional side view of an example of another plasma antenna assembly in accordance with an aspect of the present invention, with a dielectric cover sleeve being provided around the electrical conductor of the antenna, the antenna assembly being suitable for use in the apparatus of FIG. 1.
Figure 16:
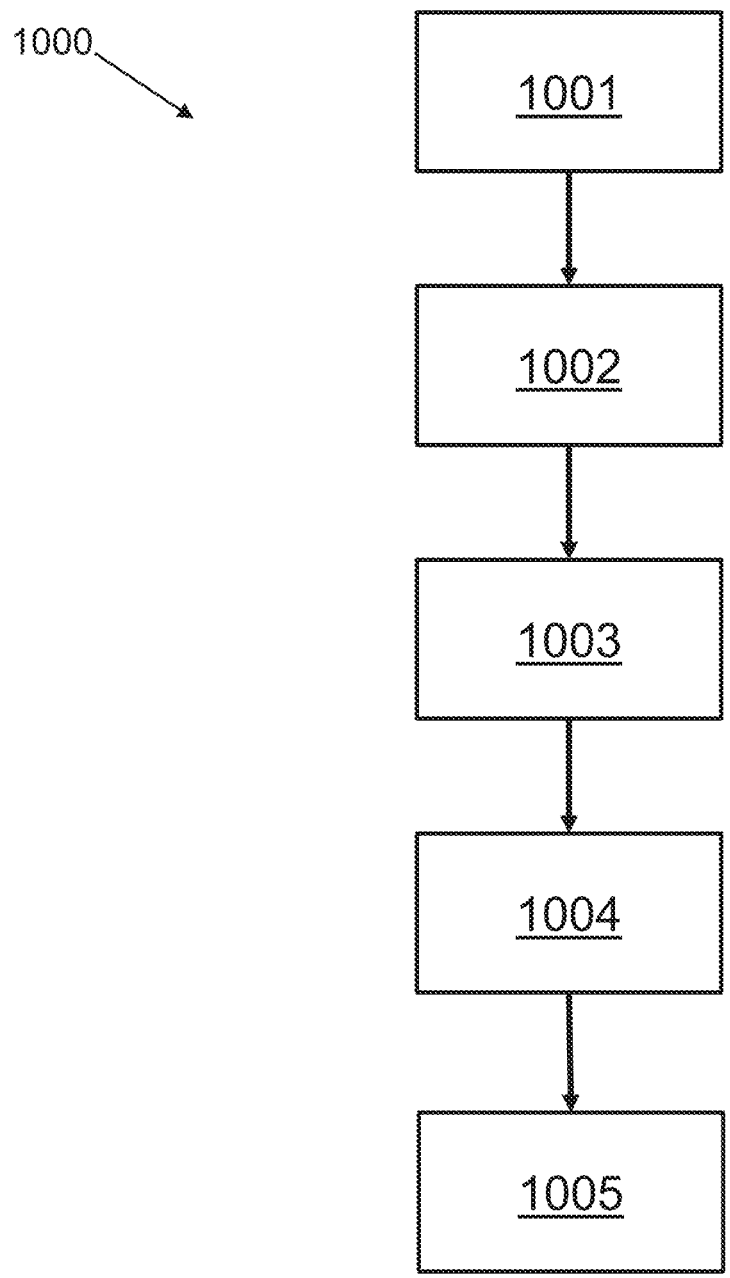
FIG. 16 shows a method of depositing a material on a substrate with the use of the apparatus of FIG. 1.

FIG. 14 demonstrates how a cover may be provided to an antenna by coating the electrical conductor with a suitable material. It is also possible to provide an alternative cover, for example, a cover in the form of a dielectric cover member, such as a sleeve. In this connection, FIG. 15 shows a schematic cross-sectional side-on view of an example of a plasma antenna assembly in accordance with the present invention. The plasma antenna assembly is generally denoted by reference number 1101 and comprises an antenna 1102 comprising an electrical conductor 1103 in the form of a copper coil. The plasma antenna assembly is located in plasma 1107. A cover member 1104 in the form of a cylindrical sleeve is provided over a central portion 1111 of the electrical conductor 1103. The cover 1104 is retained in a well-defined spatial relationship with the electrical conductor 1103 by first end spacer 1109 and second end spacer 1110, the spacers 1109, 1110 ensuring that there is a central gap 1108 between the electrical conductor 1103 and the cover 1104. The central gap 1108 is annular in cross-section and is about 1 mm in dimension between the cover 1104 and the electrical conductor 1103. The first 1109 and second 1113 end spacers do not seal-off the central, covered portion of the electrical conductor 1103 from the plasma. Therefore, plasma contacts the electrical conductor 1103. However, the central gap 1108 is sufficiently small to ensure dark space shielding in order to prevent plasma ignition in the central gap 1108. First 1116 and second 1117 uncovered portions extend from the covered central portion 1111 of the electrical conductor 1103.

The plasma antenna assembly 1101 is incorporated into a plasma antenna arrangement in which the first 1116 and second 1117 uncovered portions extend through a respective first 1114 and second 1115 partition into respective non-plasma atmospheres 1120, 1121. Since the two ends of the antenna are not exposed to plasma in the non-plasma atmospheres 1120, 1121, those ends need not be covered by the dielectric cover. Electrical contacts may be made with the first 1116 and second 1117 of the antenna arrangement.

There are small gaps, first end gap 1112 and second end gap 1113 between the respective ends of the dielectric cover 1104 and the first 1114 and second 1115 partitions. Those first 1112 and second 1113 end gaps are sufficiently small to ensure dark space shielding in order to prevent plasma ignition in the first 1112 and second 1113 end gaps. The antenna 1102 is provided with a lumen (not shown) for the receipt of a cooling fluid (not shown), such as water.

The dielectric cover 1104 is formed from silicon nitride, although those skilled in the art will realise that any suitable dielectric material may be used.

The material forming the cover 1104 should preferably have a breakdown strength sufficiently high to withstand voltage drops of about 5 kV.

Those skilled in the art will realise that the dimensions of the various features shown in FIGS. 14 and 15 are not to scale, and are depicted so that the individual features can be seen in the figures. For example, the diameter of the lumen is typically 10 mm, and the thickness of the coating typically 1-2 mm.

The arrangement of FIG. 15 is advantageous in that while the dielectric cover 1104 does not prevent contact between the plasma and the electrical conductor of the antenna, the gap between the dielectric cover 1104 and the antenna's electrical conductor 1103 is sufficiently small that ignition of the plasma does not occur adjacent the electrical conductor of the antenna. Furthermore, the arrangement of FIG. 15 is arguably simpler than the known arrangement of containing the plasma antenna within a quartz tube.

Those skilled in the art will realise that the plasma antenna assembly of FIG. 15 may be used with other aspects of the present invention. For example, the plasma antenna assembly of FIG. 15 may be used with ferrite material, as shown in FIG. 11, to focus the generation of plasma. Additionally or alternatively, the plasma antenna assembly of FIG. 15 may be used in combination with shields as described above with reference to FIGS. 4, 5, 6 and 8.

A non-illustrated embodiment combines the features of FIGS. 6, 11 and 14, and thus provides a water-cooled copper tube dielectric-coated antenna, with ferrite-based focusing of the plasma in conjunction with a half-cylinder stainless steel shield member, such that plasma is efficiently produced in a volume that is to one side of the antenna at a desired location, which enables the plasma to be used for processing, while reducing the loss of plasma through undesirable recombination or coupling effects.

A method 1000 of sputter deposition in accordance with an embodiment of the invention is now described with reference to FIGS. 1 to 3 and FIG. 16. The antenna may have the form according to any of the embodiments described herein.

By way of an overview, a high density sheet of plasma is generated by the plasma antennae within the magnetic field created in the process chamber. The plasma interacts with a target of material to be sputtered from the target onto a substrate. The plasma generation system of FIGS. 1 to 3 may have particular utility in applications requiring uniform high density plasma to be generated over relatively long lengths and widths, thereby allowing the efficient and effective use of such plasmas with large dimensioned substrates.

As an initial step (1001), the substrates to be coated are loaded onto the substrate assembly.

Process gas, for example argon, is introduced (1002) into the process chamber, while maintaining a suitable operating pressure in the process chamber 2 for a sputter process, for example 3×10-3 Torr. The magnet 6 and electromagnet 11 produce a magnetic field of strength approximately 100 to 500 Gauss between them and across the process chamber 2. The magnetic 'polarity' of the magnet and electromagnet is identical (i.e. they attract).

The plasma antenna is powered by a 2 kW supply of 13.56 MHz RF current to generate at selected regions along the length of the antenna to form one or more localised regions of remote high density plasma 24 (step 1003)—e.g. an electron density of greater than 1012 cm-3. The shape(s) of such region(s) of plasma are constrained by the magnetic field, for example forming a sheet of plasma (with a cross sectional long dimension in excess of 400 mm), there being plasma excitation in two orthogonal directions and propagation of the plasma in a third orthogonal direction, all without the need for a plasma chamber to contain the plasma.

The DC power supply 19 applies a negative polarity voltage to the target assembly 4 so that ions from the plasma 24 cause sputtering of target material 20 (step 1004). The sputter rate may be approximately proportional to the voltage applied above the voltage required to initiate sputtering. Voltages of 400 volts or more may be applied; for very high rate applications higher voltages may be used, for example 1200 volts.

After an optional time delay to allow the surface of the target material 20 to clean and stabilise, material sputtered from the targets is deposited onto the substrate and thus coats the substrate surfaces with a thin film of the target material 20 (step 1005)—optionally using a shutter system to control when and where material is sputtered onto the substrate.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

Changes may be made to how the magnetic fields are generated. For instance the magnet 6 and electromagnet 11 of FIGS. 1 to 3 may be exchanged, supplemented or even replaced by other magnet arrangements, for example additional permanent or electromagnets, in order to control and guide the plasma differently. This may be required, for example, when a ferromagnetic target material is to be sputtered and additional field shaping is necessary to prevent the plasma being directed to the target assembly and thereby extinguished.

Although most RF power systems used for plasma processing operate at 13.56 MHz, this being the frequency allocated for industrial use and thereby less prone to causing interference with other radio frequency users and so simpler to implement, alternate radio frequencies, for example 40

MHz or harmonics of 13.56 MHz, may be used to power the antennae of the embodiments.

The antenna may be mounted eccentrically in its housing, such that the axis of the antenna is spaced apart from the axis of the housing. Such an arrangement may encourage greater density of plasma to be generated at a particular circumferentially region around the antenna axis.

In certain embodiments, the housing for the plasma antenna may be constructed from an assembly of materials. The housing may for example include multiple tubes, for example of 2 to 3 mm thick quartz, placed side by side to enclose a multi-turn antenna. The housing may be constructed to contain the antenna at atmospheric pressure. The antenna may be cooled, for example using simple air flow, thereby allowing the plasma generation system to operate at higher RF powers than would otherwise be the case.

The antenna is some embodiments has lengths of the antenna that are straight (i.e. linear), possibly joined by one or more curved portions. In other embodiments, there may be one or more coiled lengths (helical coils for example) of antenna. The coiled lengths may be held within a straight length of a portion of cylindrical housing (tube).

Shielding is described herein as restricting the generation of plasma; the word restrict, restricted, or the like may be replaced with the word curtail, curtailed, or the like in the above description. Alternatively, the word restrict, restricted, or the like may be replaced with the word inhibit, inhibited or the like in the above description.

The shielding shown in FIGS. 4 to 9 can be shaped differently according to the particular requirements of the desired application.

It may be that solid conductive material which is sufficiently well-grounded may function as a shield.

The apparatus can also be used in a reactive sputter process, that is a process in which a reactive gas or vapour is introduced via the gas feed system to react with the sputtered target material or materials and thereby deposit a compound thin film on the substrate. For example, oxygen gas can be introduced into the sputter process in order to deposit oxide thin films, for example to deposit alumina by sputtering of an aluminium target in the presence of oxygen gas or silica by sputtering of a silicon target in the presence of oxygen gas.

The plasma generation system can operate independently of any sputter target allowing further applications to be realised, for example for substrate cleaning, surface modification or as an etch tool, with especial utility where large dimensioned substrates are to be processed at high throughput rates, for example in roll-to-roll ("web") coating.

The plasma generation system could also be used as a 'plasma assist' tool for other coating processes, as is typically used in evaporative coating process tools.

The plasma generation system could also be applied to coating processes based on the technique of Plasma Enhanced Chemical Vapour Deposition (PECVD).

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of generating a plasma with the use of a plasma antenna having a length, the method including driving an electrical conductor of the plasma antenna with RF frequency current to generate plasma both at a first location and at a second location spaced apart from the first location in a direction along the length of the antenna, there being a region adjacent to the antenna between the first location and the second location at which the generation of plasma is curtailed as a result of at least one shield member;

wherein the at least one shield member restricts the generation of plasma at a further region that is on the opposite side of the first location from the second location, in the direction along the length of the antenna, or on the opposite side of the second location from the first location, in the direction along the length of the antenna.

2. The method according to claim 1, wherein the plasma generated at one or both of the first location and the second location extends circumferentially around the antenna by more than 300 degrees.

3. The method according to claim 1, wherein the plasma generated at one or both of the first location and the second location extends circumferentially around the antenna by less than 270 degrees.

4. The method according to claim 1, wherein the at least one shield member restricts the generation of plasma circumferentially around the antenna by more than 300 degrees.

5. The method according to claim 1, wherein the at least one shield member restricts the generation of plasma on circumferentially around the antenna by less than 270 degrees.

6. The method according to claim 1, wherein the at least one shield member restricts the generation of plasma at one or both of the first location and the second location.

7. The method according to claim 1, wherein the at least one shield member restricts the generation of plasma at a further region that is on the opposite side of the first location from the second location, in the direction along the length of the antenna, or on the opposite side of the second location from the first location, in the direction along the length of the antenna.

8. The method according to claim 1, wherein the at least one shield member comprises material that has a relative magnetic permeability of less than 100.

9. The method according to claim 1, wherein the at least one shield member is in the form of a partial or complete Faraday cage.

10. The method according to claim 1, wherein the at least one shield member comprises an electromagnetic-shielding electrically conductive material.

11. The method according to claim 1, wherein the at least one shield member is held at a fixed potential.

12. The method according to claim 1, wherein the at least one shield member comprises dielectric material.

13. The method according to claim 1, wherein the antenna creates a magnetic field which is enhanced and/or focussed by a plasma focussing member, which comprises ferromagnetic material.

14. The method according to claim 1, wherein the antenna is at least partly contained within an air-tight tube of material.

15. The method according to claim 14, wherein the at least one shield member is mounted externally of the air-tight tube of material.

16. The method according to claim 1, wherein the length of the antenna between the first and second locations is linear.

17. The method according to claim 1, wherein the method includes generating plasma with the use of at least two lengths of plasma antenna being spaced laterally apart from each other.

18. The method according to claim 1, wherein the method includes confining the plasma so as to cause interaction between the plasma and a target.

19. A plasma antenna for use in the method of claim 1, the antenna being provided together with said at least one shield member, the antenna and said at least one shield member together forming a plasma antenna assembly.

20. A plasma reactor comprising one or more plasma antenna assemblies according to claim 19.

21. The plasma reactor according to claim 20, wherein the plasma antenna is configured to generate a plasma remote from a sputter target.

22. A deposition apparatus comprising one or more plasma antenna assemblies according to claim 19.

23. A method of depositing a material on a substrate, the method comprising:
generating a plasma remote from one or more sputter targets suitable for plasma sputtering using a plasma antenna having a length, by driving an electrical conductor of the plasma antenna with RF frequency current to generate plasma both at a first location and at a second location spaced apart from the first location in a direction along the length of the antenna, there being a region adjacent to the antenna between the first location and the second location at which the generation of plasma is curtailed as a result of at least one shield member,
generating sputtered material from the one or more sputter targets using the plasma; and
depositing the sputtered material onto the substrate.

24. The method according to claim 23, wherein the step of generating sputtered material from the target or targets using the plasma includes confining and/or controlling, with the use of an electric field and/or a magnetic field, the plasma in such a way that the plasma sputters material from a target.

25. The method according to claim 23, wherein the plasma has uniform density at the target as a result, at least in part, of the use of the at least one shield member.

26. An electronic device comprising a component which comprises a layer of material deposited using the method of claim 23.

27. The electronic device according to claim 26, wherein the component includes the substrate onto which the layer of material has been deposited.

28. A plasma antenna assembly, the assembly comprising an antenna and a housing, wherein
the antenna has a length,
the antenna is configured, when powered by RF frequency current, to generate plasma both at a first location and at a second location spaced apart from the first location in a direction along the length of the antenna, and
the housing has at least one shield member which is arranged such that there is a region adjacent to the antenna between the first location and the second location at which, in use, the generation of plasma is inhibited as a result of said at least one shield member;
wherein the at least one shield member is configured to restrict the generation of plasma at a further region that is on the opposite side of the first location from the second location, in the direction along the length of the antenna, or on the opposite side of the second location from the first location, in the direction along the length of the antenna.

* * * * *